US012652822B2

(12) United States Patent
Chang et al.

(10) Patent No.: US 12,652,822 B2
(45) Date of Patent: Jun. 9, 2026

(54) VOID-FREE CONDUCTIVE CONTACT FORMATION

(71) Applicant: Taiwan Semiconductor Manufacturing Company, Ltd., Hsin-Chu (TW)

(72) Inventors: Cheng-Wei Chang, Taipei City (TW); Chien Chang, Hsinchu (TW); Kan-Ju Lin, Kaohsiung City (TW); Harry Chien, Chandler, AZ (US); Shuen-Shin Liang, Hsinchu County (TW); Chia-Hung Chu, Taipei City (TW); Sung-Li Wang, Hsinchu County (TW); Shahaji B. More, Hsinchu City (TW); Yueh-Ching Pai, Taichung City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 559 days.

(21) Appl. No.: 18/191,750

(22) Filed: Mar. 28, 2023

(65) Prior Publication Data

US 2024/0021687 A1 Jan. 18, 2024

Related U.S. Application Data

(60) Provisional application No. 63/407,989, filed on Sep. 19, 2022, provisional application No. 63/389,148, filed on Jul. 14, 2022.

(51) Int. Cl.
*H10D 30/62* (2025.01)
*H10D 30/00* (2025.01)
(Continued)

(52) U.S. Cl.
CPC ....... *H10D 30/6219* (2025.01); *H10D 30/024* (2025.01); *H10D 30/507* (2025.01);
(Continued)

(58) Field of Classification Search
CPC ............. H10D 30/6219; H10D 30/014; H10D 30/024; H10D 30/43; H10D 30/6211;
(Continued)

(56) References Cited

U.S. PATENT DOCUMENTS 8,772,109 B2 7/2014 Colinge
8,785,285 B2 7/2014 Tsai et al.
(Continued)

FOREIGN PATENT DOCUMENTS

CN 107068680 A * 8/2017 ....... H01L 21/76895
TW 202213468 A 4/2022
TW 202226504 A 7/2022

*Primary Examiner* — Earl N Taylor
(74) *Attorney, Agent, or Firm* — HAYNES AND BOONE, LLP

(57) ABSTRACT

A source/drain component is disposed over an active region and surrounded by a dielectric material. A source/drain contact is disposed over the source/drain component. The source/drain contact includes a conductive capping layer and a conductive material having a different material composition than the conductive capping layer. The conductive material has a recessed bottom surface that is in direct contact with the conductive capping layer. A source/drain via is disposed over the source/drain contact. The source/drain via and the conductive material have different material compositions. The conductive capping layer contains tungsten, the conductive material contains molybdenum, and the source/drain via contains tungsten.

20 Claims, 35 Drawing Sheets

(51) Int. Cl.

| | |
|---|---|
| *H10D 30/01* | (2025.01) |
| *H10D 30/67* | (2025.01) |
| *H10D 62/10* | (2025.01) |
| *H10D 64/01* | (2025.01) |
| *H10D 64/23* | (2025.01) |
| *H10D 84/01* | (2025.01) |
| *H10D 84/03* | (2025.01) |
| *H10D 84/83* | (2025.01) |
| *H10W 20/00* | (2026.01) |

(52) U.S. Cl.
CPC ..... *H10D 30/6211* (2025.01); *H10D 30/6729* (2025.01); *H10D 62/121* (2025.01); *H10D 64/0112* (2026.01); *H10D 64/256* (2025.01); *H10D 84/013* (2025.01); *H10D 84/834* (2025.01); *H10W 20/033* (2026.01); *H10W 20/054* (2026.01); *H10D 84/038* (2025.01); *H10W 20/057* (2026.01)

(58) Field of Classification Search
CPC .......... H10D 30/6729; H10D 30/6735; H10D 62/121; H10D 84/013; H10D 84/038; H10D 84/834; H10D 30/62; H10D 30/6713; H10D 30/6757; H10D 64/256; H10D 62/151; H10D 84/0184; H10D 64/254; H10D 64/62; H01L 21/76879; H01L 21/28518; H01L 21/76843; H01L 21/76865; H01L 21/76805; H01L 21/76877; B82Y 10/00; H10B 10/125; H10B 10/12

See application file for complete search history.

(56) References Cited

U.S. PATENT DOCUMENTS

| | | | | |
|---|---|---|---|---|
| 8,816,444 | B2 | 8/2014 | Wann et al. | |
| 8,823,065 | B2 | 9/2014 | Wang et al. | |
| 8,860,148 | B2 | 10/2014 | Hu et al. | |
| 9,105,490 | B2 | 8/2015 | Wang et al. | |
| 9,236,267 | B2 | 1/2016 | De et al. | |
| 9,236,300 | B2 | 1/2016 | Liaw | |
| 9,520,482 | B1 | 12/2016 | Chang et al. | |
| 9,576,814 | B2 | 2/2017 | Wu et al. | |
| 10,998,241 | B2 * | 5/2021 | Khaderbad | H10D 84/853 |
| 11,532,561 | B2 * | 12/2022 | Lin | H01L 23/535 |
| 12,266,572 | B2 * | 4/2025 | More | H10D 30/024 |
| 2015/0069526 | A1 * | 3/2015 | Basker | H10D 30/024 |
| | | | | 438/283 |
| 2015/0270179 | A1 * | 9/2015 | Alptekin | H01L 21/76855 |
| | | | | 257/757 |
| 2020/0033738 | A1 | 1/2020 | Aoki | |
| 2020/0091011 | A1 * | 3/2020 | Khaderbad | H10D 84/017 |
| 2020/0135858 | A1 * | 4/2020 | Chiu | H10D 30/024 |
| 2021/0038836 | A1 | 2/2021 | Rogan | |
| 2021/0086950 | A1 | 3/2021 | Sill | |
| 2021/0098376 | A1 * | 4/2021 | Lin | H01L 23/535 |
| 2021/0351079 | A1 * | 11/2021 | Su | H10D 84/0128 |
| 2021/0351303 | A1 * | 11/2021 | Ju | H01L 21/76897 |
| 2022/0051948 | A1 * | 2/2022 | More | H10D 30/6211 |
| 2022/0223526 | A1 * | 7/2022 | Min | H01L 23/535 |
| 2022/0278211 | A1 * | 9/2022 | Tsai | H10D 30/62 |
| 2022/0310811 | A1 * | 9/2022 | Min | H10D 84/038 |

* cited by examiner

1000

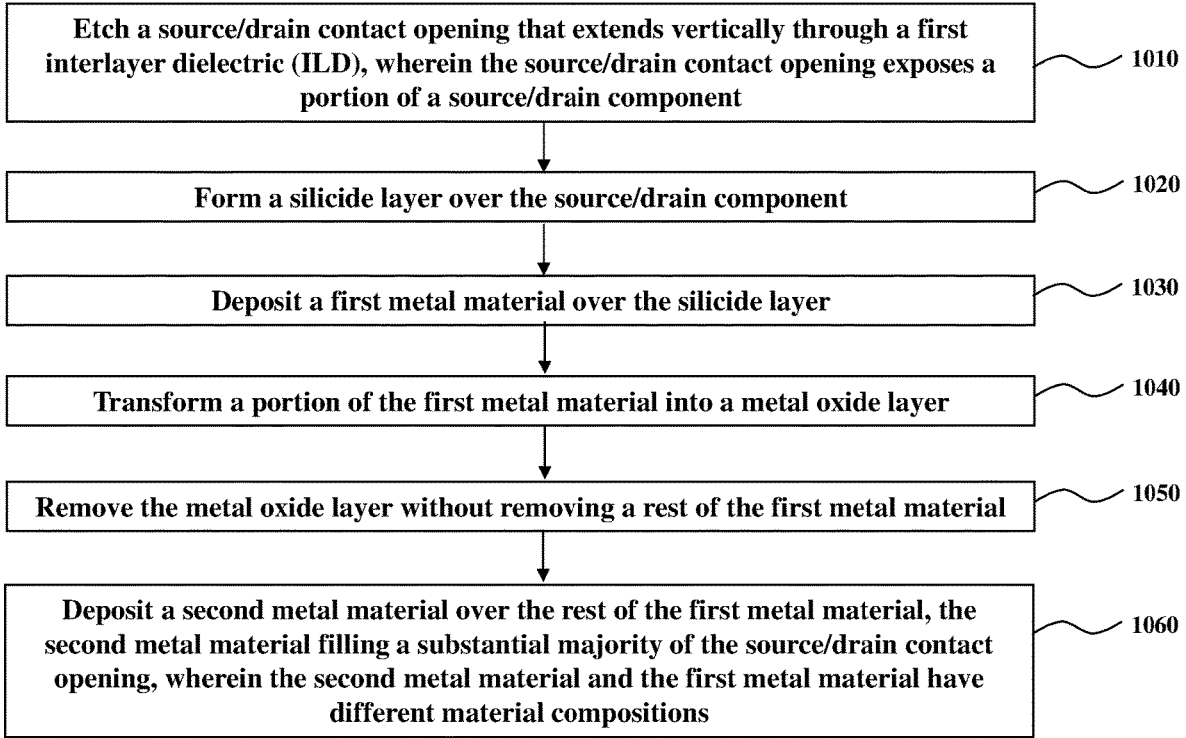

| Etch a source/drain contact opening that extends vertically through a first interlayer dielectric (ILD), wherein the source/drain contact opening exposes a portion of a source/drain component | 1010 |

Form a silicide layer over the source/drain component — 1020

Deposit a first metal material over the silicide layer — 1030

Transform a portion of the first metal material into a metal oxide layer — 1040

Remove the metal oxide layer without removing a rest of the first metal material — 1050

Deposit a second metal material over the rest of the first metal material, the second metal material filling a substantial majority of the source/drain contact opening, wherein the second metal material and the first metal material have different material compositions — 1060

Fig. 23

VOID-FREE CONDUCTIVE CONTACT FORMATION

PRIORITY DATA

The present application is a Utility U.S. Patent Application of Provisional U.S. Patent Application No. 63/389,148, entitled "Void-Free Conductive Contact Formation", filed on Jul. 14, 2022, and Provisional U.S. Patent Application No. 63/407,989, entitled "Void-Free Conductive Contact Formation", filed on Sep. 19, 2022, disclosures of which is hereby incorporated by reference in their entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

However, as the scaling down process continues, it has become more difficult to fabricate IC device without performance degradations. For example, as device sizes become smaller, various metallization features, such as source/drain contacts or vias, may be more difficult to form without causing defects. In many instances, the source/drain contacts formed by conventional fabrication processes may have one or more bubbles or voids trapped therein, which may increase the parasitic electrical resistance of the source/drain contacts and thus degrade the electrical performance of the IC device.

Therefore, although existing semiconductor devices and their method of fabrication have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

FIGS. 2A-15A illustrate a series of X-cut cross-sectional views of a semiconductor device at various stages of fabrication according to embodiments of the present disclosure.

FIGS. 2B-12B illustrate a series of Y-cut cross-sectional views of a semiconductor device at various stages of fabrication according to embodiments of the present disclosure.

FIG. 23 is a flowchart illustrating a method of fabricating a semiconductor device according to various aspects of the present disclosure.

DETAILED DESCRIPTION

Figures 1A, 1B:
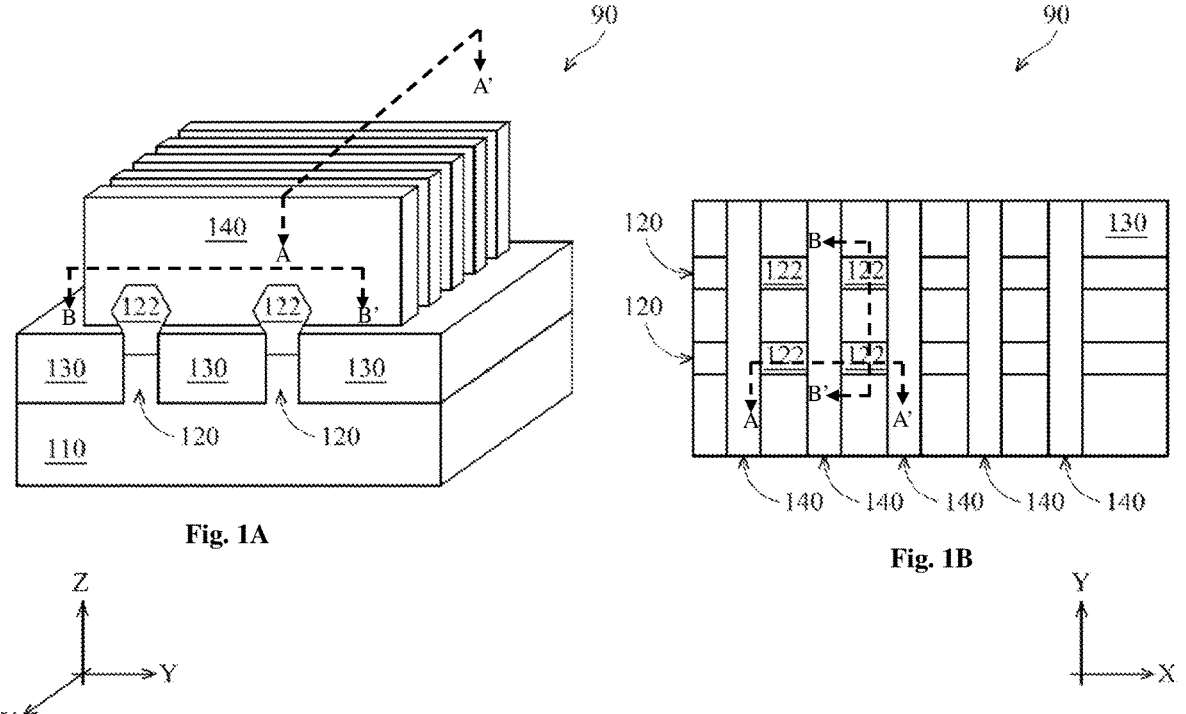
FIG. 1A illustrates a three-dimensional perspective view of a FinFET device.
FIG. 1B illustrates a top view of a FinFET device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to a unique fabrication process flow to form metallization features, such as source/drain contacts, that are free of voids or bubbles. In more detail, as semiconductor device sizes shrink with each technology node, it has become increasingly more difficult to form IC components with small sizes. As an example, conventional methods of forming source/drain contacts may result in a source/drain contact having voids (e.g., air gaps or air bubbles) trapped therein, which may be considered a device defect. Such a device defect may lead to a higher parasitic resistance associated with the source/drain contact, which may degrade device performance (e.g., slower device speed, or more power consumption) and/or lower device yield, which may be reflected as a part of a wafer acceptance test.

To address the issues discussed above, the present disclosure utilizes a novel fabrication process flow to form the source/drain contacts that are substantially void-free. In some embodiments, a source/drain contact opening is etched through an interlayer dielectric (ILD), such that the source/drain contact opening exposes an upper surface of an epitaxially grown source/drain component. A silicide material may be formed over the source/drain component. The silicide material is formed to have a concave upper surface.

A two-step deposition process may then be performed to form a source/drain contact over the concave upper surface of the silicide material. In a first step of the two-step deposition process, a physical vapor deposition (PVD) process may be performed to deposit a conductive capping layer (e.g., a tungsten conductive capping layer) over the silicide material. An upper surface of the conductive capping layer is specifically configured to achieve a convex profile in a cross-sectional view. The PVD process also deposits conductive materials on sidewalls of the source/drain contact opening. An oxygen treatment may then be performed to oxidize portions of the conductive capping layer and the silicide material. The oxidized portions of the conductive capping layer and the silicide material may then be removed, which exposes the unoxidized portion of the conductive capping layer (still having a convex upper surface) and the sidewalls of the source/drain contact opening.

In a second step of the deposition process, a chemical vapor deposition (CVD) process is performed to deposit a conductive material over the conductive capping layer. In some embodiments, the conductive material contains molybdenum and may be formed in a barrier-less manner. In other words, the formation of the conductive material needs no barrier or glue layers, and it may come into direct physical contact with the portions of the ILD that define the sidewalls of the opening.

The source/drain contact is formed by the conductive capping layer (e.g., the tungsten capping layer formed by the PVD deposition process) and the conductive material (e.g., the molybdenum conductive material formed by the CVD deposition process) collectively. Such a source/drain contact may be substantially free of voids or bubbles, which may be attributed to at least the following factors:

The PVD process used to form the conductive capping layer (e.g., tungsten) and the CVD process used to form the conductive material (e.g., molybdenum) have deposition process parameters (e.g., temperature, pressure, duration, etc.) that are specifically configured to reduce the likelihood of bubble/void formation.

The downwardly recessed upper surface of the silicide layer makes it even easier to deposit the conductive capping layer (e.g., tungsten) thereon without trapping bubbles/voids therein.

Once the conductive capping layer has been deposited, the aspect ratio of the source/drain contact opening is reduced (i.e., a smaller depth versus the same width), which also makes it easier to deposit the conductive material (e.g., molybdenum) without trapping bubbles/voids therein.

Since the resulting source/drain contact is substantially free of voids or bubbles, parasitic resistance is reduced, and structural integrity may be enhanced. Consequently, device performance (e.g., faster speed or lower power consumption) and/or yield may be improved.

Figure 1C:
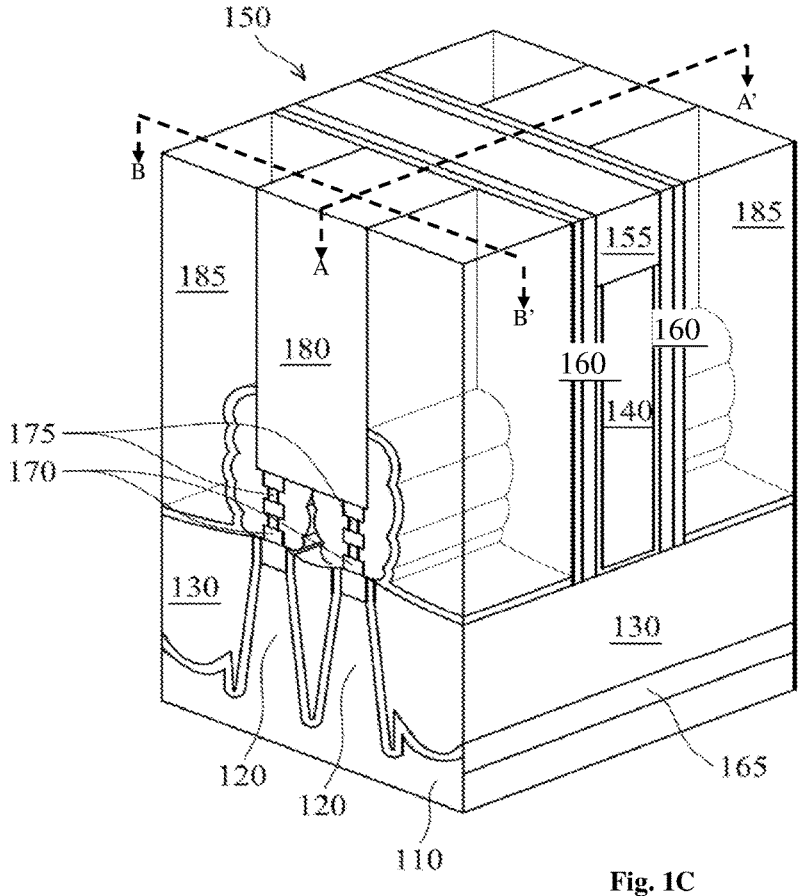
FIG. 1C illustrates a three-dimensional perspective view of a multi-channel gate-all-around (GAA) device.
Figure 1C:
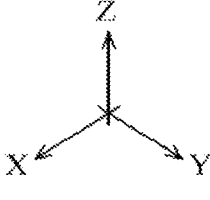
Figure 20:
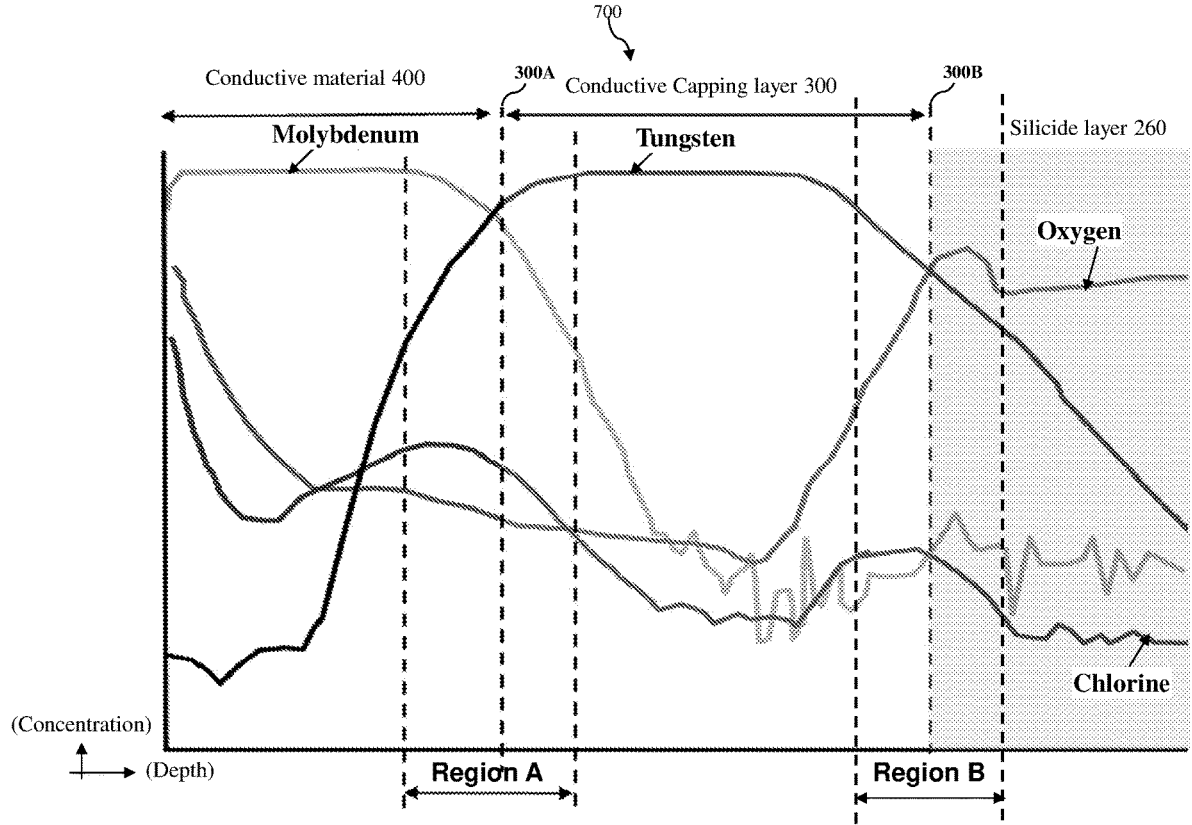
FIG. 20 illustrates a graph according to embodiments of the present disclosure.
Figure 21:
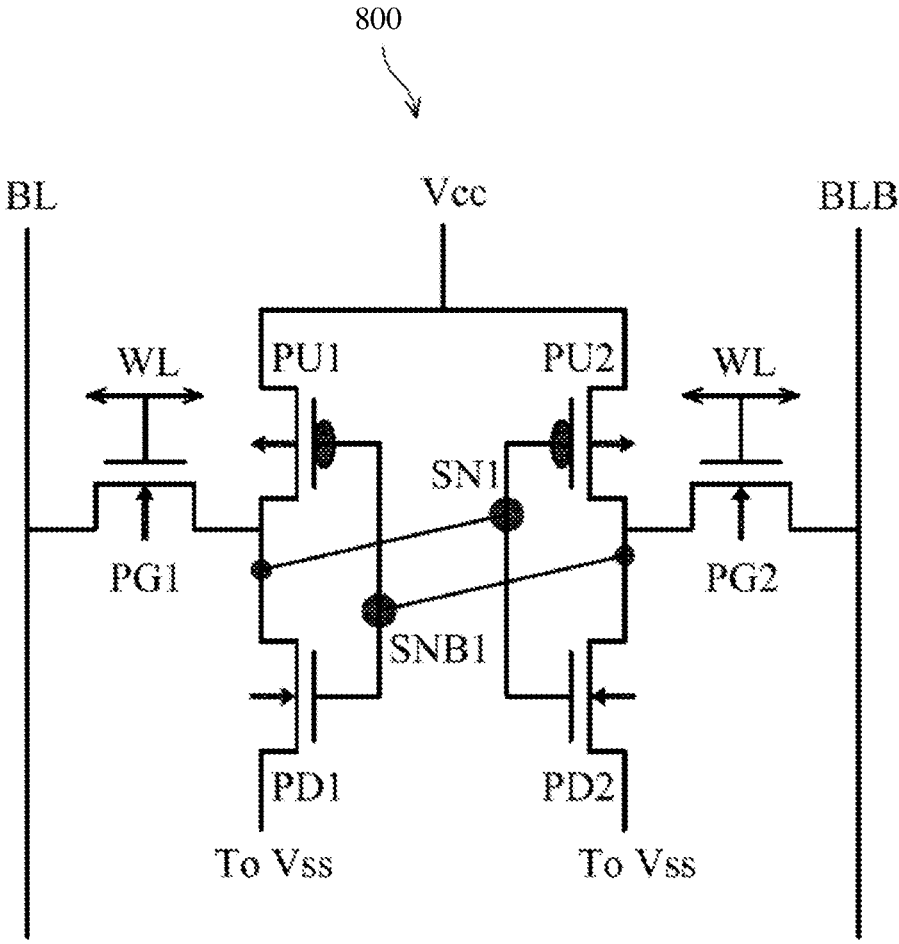
FIG. 21 is a circuit schematic of an SRAM cell according to various aspects of the present disclosure.
Figure 22:
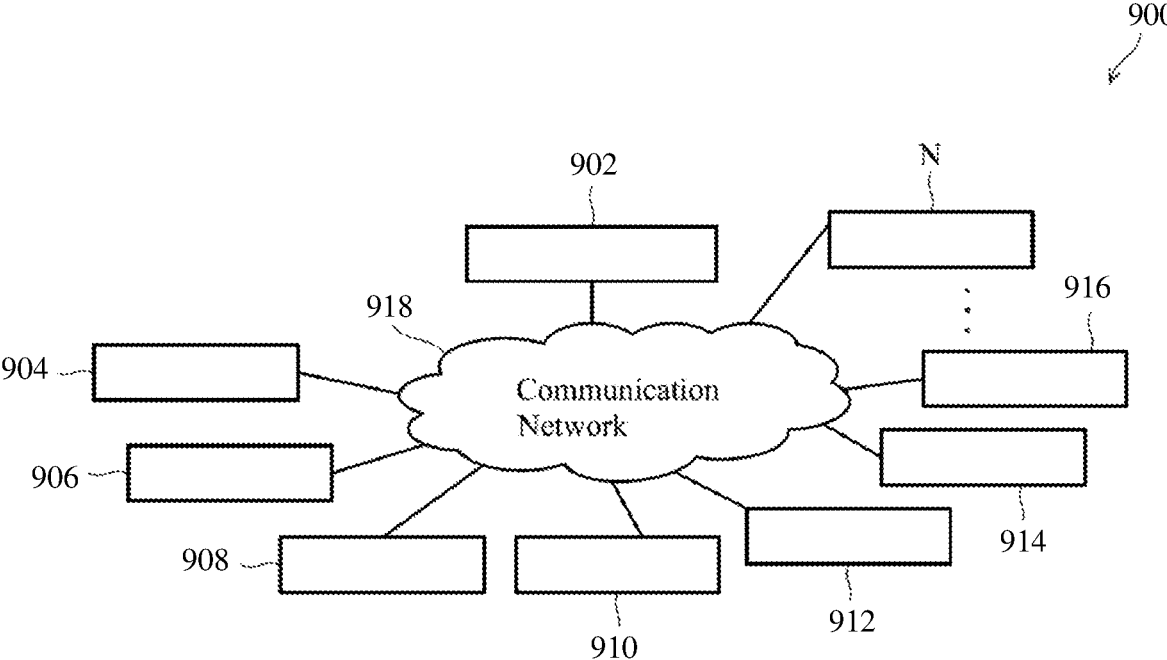
FIG. 22 is a block diagram of a manufacturing system according to various aspects of the present disclosure.

The various aspects of the present disclosure will now be discussed below with reference to FIGS. 1A, 1B, 1C, 2A-15A, 2B-12B, and 16-23. In more detail, FIGS. 1A-B illustrate an example FinFET device, and FIG. 1C illustrates an example GAA device. FIGS. 2A-15A illustrate X-cut cross-sectional side views of an IC device at various stages of fabrication according to embodiments of the present disclosure. FIGS. 2B-12B illustrate Y-cut cross-sectional side views of the IC device at various stages of fabrication according to embodiments of the present disclosure. FIGS. 16-19 illustrate planar top views of the IC device at various depth levels according to embodiments of the present disclosure. FIG. 20 illustrates a graph that demonstrates the variation of concentration levels of various elements within the IC device across different depth levels according to embodiments of the present disclosure. FIG. 21 illustrates a memory device in which the IC device of the present disclosure may be implemented. FIG. 22 illustrates a semiconductor fabrication system that may be used to fabricate the IC device of the present disclosure. FIG. 23 illustrates a flowchart of a method of fabricating the IC device of the present disclosure.

Referring now to FIGS. 1A and 1B, a three-dimensional perspective view and a top view of a portion of an Integrated Circuit (IC) device 90 are illustrated, respectively. The IC device 90 is implemented using field-effect transistors (FETs) such as three-dimensional fin-line FETs (FinFETs). FinFET devices have semiconductor fin structures that protrude vertically out of a substrate. The fin structures are active regions, from which source/drain region(s) and/or channel regions are formed. Source/drain region(s) may refer to a source or a drain, individually or collectively dependent upon the context. A source/drain region may also refer to a region that provides a source and/or drain for multiple devices. The gate structures partially wrap around the fin structures. In recent years, FinFET devices have gained popularity due to their enhanced performance compared to conventional planar transistors.

As shown in FIG. 1A, the IC device 90 includes a substrate 110. The substrate 110 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor such as SiGe, GaAsP, AlInAs, AlGaAs, GaInAs, GaInP, GaInAsP, and/or other suitable materials. The substrate 110 may be a single-layer material having a uniform composition. Alternatively, the substrate 110 may include multiple material layers having similar or different compositions suitable for IC device manufacturing. In one example, the substrate 110 may be a silicon-on-insulator (SOI) substrate having a semiconductor silicon layer formed on a silicon oxide layer. In another example, the substrate 110 may include a conductive layer, a semiconductor layer, a dielectric layer, other layers, or combinations thereof. Various doped regions, such as source/drain regions, may be formed in or on the substrate 110. The doped regions may be doped with n-type dopants, such as phosphorus or arsenic, and/or p-type dopants, such as boron, depending on design requirements. The doped regions may be formed directly on the substrate 110, in a p-well structure, in an n-well structure, in a dual-well structure, or using a raised structure. Doped regions may be formed by implantation of dopant atoms, in-situ doped epitaxial growth, and/or other suitable techniques.

Three-dimensional active regions 120 are formed on the substrate 110. The active regions 120 may include elongated fin-like structures that protrude upwardly out of the substrate 110. As such, the active regions 120 may be interchangeably referred to as fin structures 120 or fins 120 hereinafter. The fin structures 120 may be fabricated using suitable processes including photolithography and etch processes. The photolithography process may include forming a photoresist layer overlying the substrate 110, exposing the photoresist to a pattern, performing post-exposure bake processes, and developing the photoresist to form a masking element (not shown) including the resist. The masking element is then used for etching recesses into the substrate 110, leaving the fin structures 120 on the substrate 110. The etching process may include dry etching, wet etching, reactive ion etching (RIE), and/or other suitable processes. In some embodiments, the fin structure 120 may be formed by double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. As an example, a layer may be formed over a substrate and patterned using a photolithography process. Spacers are formed alongside the patterned layer using a self-aligned process. The layer is then removed, and the remaining spacers, or mandrels, may then be used to pattern the fin structures 120.

The IC device 90 also includes source/drain components 122 formed over the fin structures 120. The source/drain components 122 (also referred to source/drain regions) may refer to a source or a drain of a transistor, individually or collectively, dependent upon the context. The source/drain components 122 may include epi-layers that are epitaxially grown on the fin structures 120. The IC device 90 further includes isolation structures 130 formed over the substrate 110. The isolation structures 130 electrically separate various components of the IC device 90. The isolation structures 130 may include silicon oxide, silicon nitride, silicon oxynitride, fluoride-doped silicate glass (FSG), a low-k dielectric material, and/or other suitable materials. In some embodiments, the isolation structures 130 may include shallow trench isolation (STI) features. In one embodiment, the isolation structures 130 are formed by etching trenches in the substrate 110 during the formation of the fin structures 120. The trenches may then be filled with an isolating material described above, followed by a chemical mechanical planarization (CMP) process. Other isolation structure such as field oxide, local oxidation of silicon (LOCOS), and/or other suitable structures may also be implemented as the isolation structures 130. Alternatively, the isolation structures 130 may include a multi-layer structure, for example, having one or more thermal oxide liner layers.

The IC device 90 also includes gate structures 140 formed over and engaging the fin structures 120 on three sides in a channel region of each fin 120. In other words, the gate structures 140 each wrap around a plurality of fin structures 120. The gate structures 140 may be dummy gate structures (e.g., containing an oxide gate dielectric and a polysilicon gate electrode), or they may be High-k metal gate (HKMG) structures that contain a high-k gate dielectric and a metal gate electrode, where the HKMG structures are formed by replacing the dummy gate structures. Though not depicted herein, the gate structure 140 may include additional material layers, such as an interfacial layer over the fin structures 120, a capping layer, other suitable layers, or combinations thereof.

Referring to FIGS. 1A-1B, multiple fin structures 120 are each oriented lengthwise along the X-direction, and multiple gate structures 140 are each oriented lengthwise along the Y-direction, i.e., generally perpendicular to the fin structures 120. In many embodiments, the IC device 90 includes additional features such as gate spacers disposed along sidewalls of the gate structures 140, hard mask layer(s) disposed over the gate structures 140, and numerous other features.

FIG. 1C illustrates a three-dimensional perspective view of an example multi-channel gate-all-around (GAA) device 150. GAA devices have multiple elongated nano-structure channels that may be implemented as nano-tubes, nano-sheets, or nano-wires. For reasons of consistency and clarity, similar components in FIG. 1C and FIGS. 1A-1B will be labeled the same. For example, active regions such as fin structures 120 rise vertically upwards out of the substrate 110 in the Z-direction. The isolation structures 130 provide electrical separation between the fin structures 120. The gate structure 140 is located over the fin structures 120 and over the isolation structures 130. A layer 155 is located over the gate structure 140, and gate spacer structures 160 are located on sidewalls of the gate structure 140. A capping layer 165 is formed over the fin structures 120 to protect the fin structures 120 from oxidation during the forming of the isolation structures 130.

A plurality of nano-structures 170 is disposed over each of the fin structures 120. The nano-structures 170 may include nano-sheets, nano-tubes, or nano-wires, or some other type of nano-structure that extends horizontally in the X-direction. Portions of the nano-structures 170 under the gate structure 140 may serve as the channels of the GAA device 150. Dielectric inner spacers 175 may be disposed between the nano-structures 170. In addition, although not illustrated for reasons of simplicity, each stack of the nano-structures 170 may be wrapped around circumferentially by a gate dielectric as well as a gate electrode. In the illustrated embodiment, the portions of the nano-structures 170 outside the gate structure 140 may serve as the source/drain features of the GAA device 150. However, in some embodiments, continuous source/drain features may be epitaxially grown over portions of the fin structures 120 outside of the gate structure 140. Regardless, conductive source/drain contacts 180 may be formed over the source/drain features to provide electrical connectivity thereto. An interlayer dielectric (ILD) 185 is formed over the isolation structures 130 and around the gate structure 140 and the source/drain contacts 180. The ILD 185 may be referred to as an ILD0 layer. In some embodiments, the ILD 185 may include silicon oxide, silicon nitride, or a low-k dielectric material.

The FinFET devices of FIGS. 1A-1B and the GAA devices of FIG. 1C may be utilized to implement electrical circuitries having various functionalities, such as memory devices (e.g., static random access memory (SRAM) devices), logic circuitries, input/output (I/O) devices, application specific integrated circuit (ASIC) devices, radio frequency (RF) circuitries, drivers, micro-controllers, central processing units (CPUs), image sensors, etc., as non-limiting examples.

FIGS. 2A-15A and 2B-12B illustrate diagrammatic fragmentary cross-sectional views of portions of an IC device 200 at various stages of fabrication according to various embodiments of the present disclosure. In more detail, FIGS. 2A-15A illustrate the cross-sectional views along a X-Z plane, which may be taken alone a cutline A-A' shown in FIGS. 1A-1C. As such, FIGS. 2A-15A may be referred to as X-cuts or X-cut cross-sectional views. Meanwhile, FIGS. 2B-12B illustrate the cross-sectional views along a Y-Z plane, which may be taken alone a cutline B-B' shown in FIGS. 1A-1C. As such, FIGS. 2B-12B may be referred to as Y-cuts or Y-cut cross-sectional views.

Figure 2A:
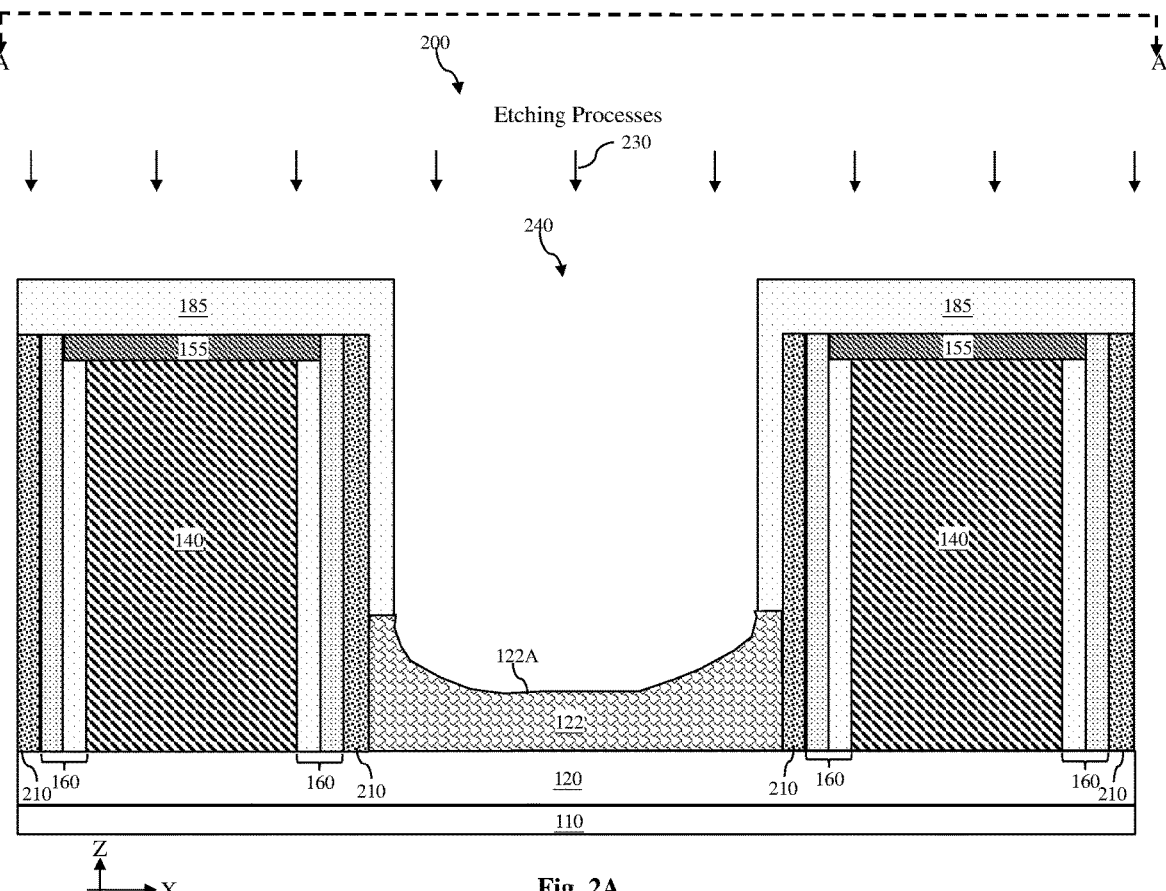
Figure 2B:
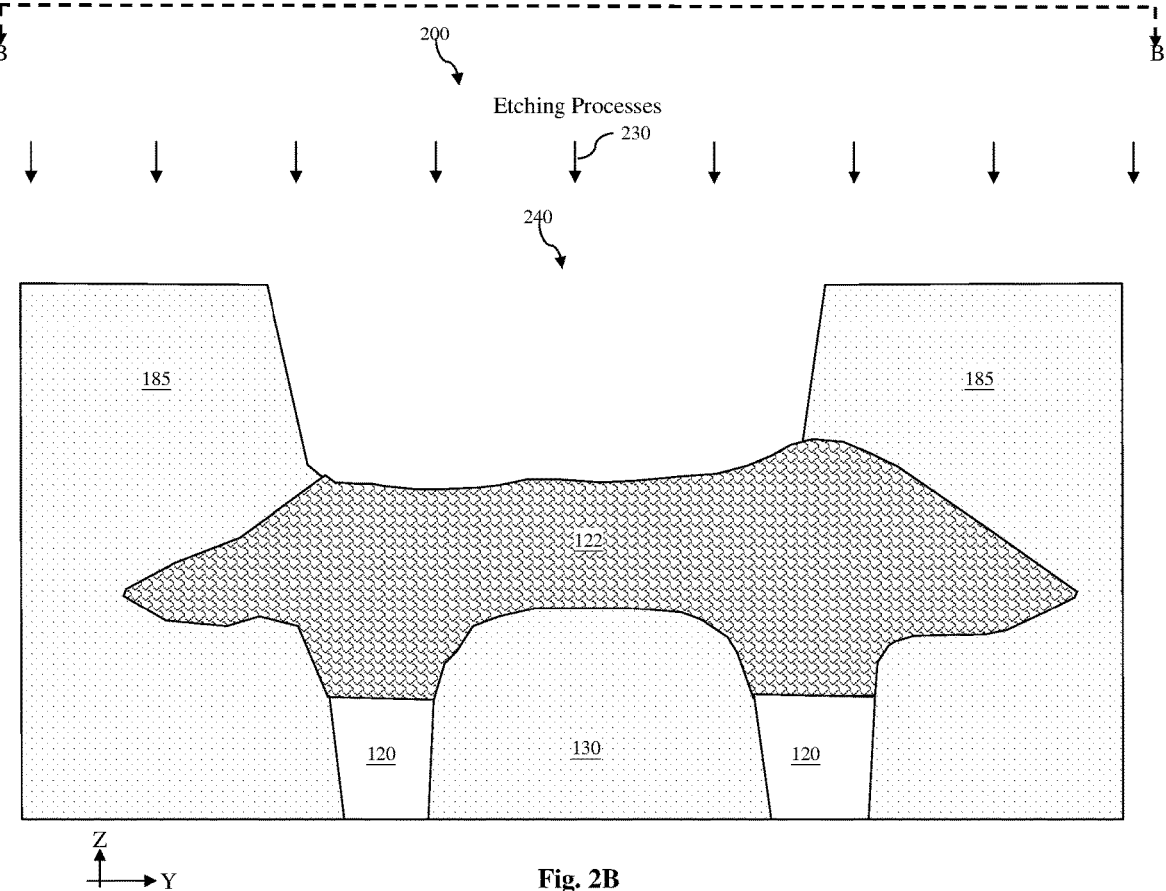

Referring now to FIGS. 2A-2B, the IC device 200 includes the substrate 110 discussed above, which may comprise an elementary (single element) semiconductor, a compound semiconductor, an alloy semiconductor, and/or other suitable materials. Electrical circuitries may be formed in (or over) the substrate 110. The electrical circuitries may be implemented at least in part using transistors, such as the FinFET transistors shown in FIGS. 1B-1C and/or the GAA transistors shown in FIG. 1C. For reasons of simplicity, the details of the electrical circuitries are not illustrated in FIGS. 2A-2B or the subsequent figures. Active regions 120 may be formed over (or as a part of) the substrate 110. For example, the active regions 120 may include the fin structures 120 or the stacks of nano-structures 170 discussed above in association with FIGS. 1A-1C.

High-k metal gate (HKMG) structures 140 are formed over the active regions 120. For example, each HKMG structure 140 may partially wrap around one of the active regions 120 (e.g., wrapping around a fin structure). As discussed above, the HKMG structures 140 are formed by replacing dummy gate structures, and they may each include a high-k gate dielectric and a metal-containing gate electrode. Example materials of the high-k gate dielectric include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, or combinations thereof. The metal-containing gate electrode may include one or more work function metal layers and one or more fill metal layers. The work function metal layers may be configured to tune a work function of the respective transistor. Example materials for the work function metal layers may include titanium nitride (TiN), Titanium aluminide (TiAl), tantalum nitride (TaN), titanium carbide (Tic), tantalum carbide (TaC), tungsten carbide (WC), titanium aluminum nitride (TiAlN), zirconium aluminide (ZrAl), tungsten aluminide (WAl), tantalum aluminide (TaAl), hafnium aluminide (HfAl), or combinations thereof. The fill metal layer may serve as a main conductive portion of the gate electrode layer. Though not depicted herein, the gate structure 140 may include additional material layers, such as an interfacial layer between the active region 120 and the gate dielectric layer.

Gate spacer structures 160 are formed on the sidewalls of the HKMG structures 140. The gate spacer structures 160 may include one or more suitable dielectric materials, for example, $SiO_x$ (where x is a positive integer), SiN, SiON, SiOC, SiCN, or SiOCN. In the illustrated embodiment, the gate spacer structures 160 include at least a first gate spacer layer that is in direct contact with the sidewalls of the HKMG structure 140, as well as a second gate spacer layer that is formed on the sidewalls of the first gate spacer layer. In other words, the first gate spacer layer may be located between the HKMG structure 140 and the second gate spacer layer. In some embodiments, the first gate spacer layer and the second gate spacer layer may have different material compositions. It is also understood that the gate spacer structures 160 may include just one gate spacer layer in some embodiments, or more than two gate spacer layers in other embodiments. The gate spacer structures 160 may also each include an air spacer in some embodiments.

An etching-stop layer 210 is also disposed on the sidewalls of the gate spacer structures 160. In some embodiments, the etching-stop layer 210 includes a dielectric material, which may have a different material composition than the gate spacer structures 160.

The layer 155 is disposed on the upper surface of each of the HKMG structures 140. In some embodiments, the layer 155 may be a conductive layer, for example, a tungsten-containing layer. For example, the layer 155 may include fluorine-free tungsten (FFW), which may be formed using a tungsten chloride $WCl_x$ precursor, where x is a positive integer.

The interlayer dielectric (ILD) 185 is disposed over the HKMG structures 140, the layer 155, the gate spacer structures 160, and the etching-stop layer 210. In some embodiments, the ILD 185 may include silicon oxide, silicon nitride, silicon oxygen carbide, silicon oxycarbon nitride, or a low-k dielectric material. As shown in FIG. 2A, portions of the ILD 185 may be formed over the source/drain component 122 (also referred to as a source/drain region), which may refer to a source or a drain of a transistor, individually or collectively, dependent upon the context. The source/drain component 122 may be epitaxially grown over the active region 120. As shown in FIG. 2B, the source/drain component 122 may include source/drains epitaxially grown from different active regions 120 and then merged into one another to form a collective source/drain. Portions of the ILD 185 and the isolation structures 130 (e.g., STI) may laterally surround the source/drain component 122.

As shown in FIGS. 2A-2B, one or more etching processes 230 may be performed to the IC device 200 to form a source/drain contact opening 240. In some embodiments, the one or more etching processes 230 may include a wet etching process, a dry etching process, or combinations thereof. The one or more etching processes 230 partially removes materials from the ILD 185 and the source/drain component 122, such that the source/drain contact opening 240 vertically extends through the ILD 185 and forms a recessed (or concave) upper surface 122A for the source/drain component 122, as shown in FIG. 2A. However, the upper surface of the portion of the source/drain component 122 may or may not exhibit such a recessed profile in FIG. 2B.

Figure 3A:
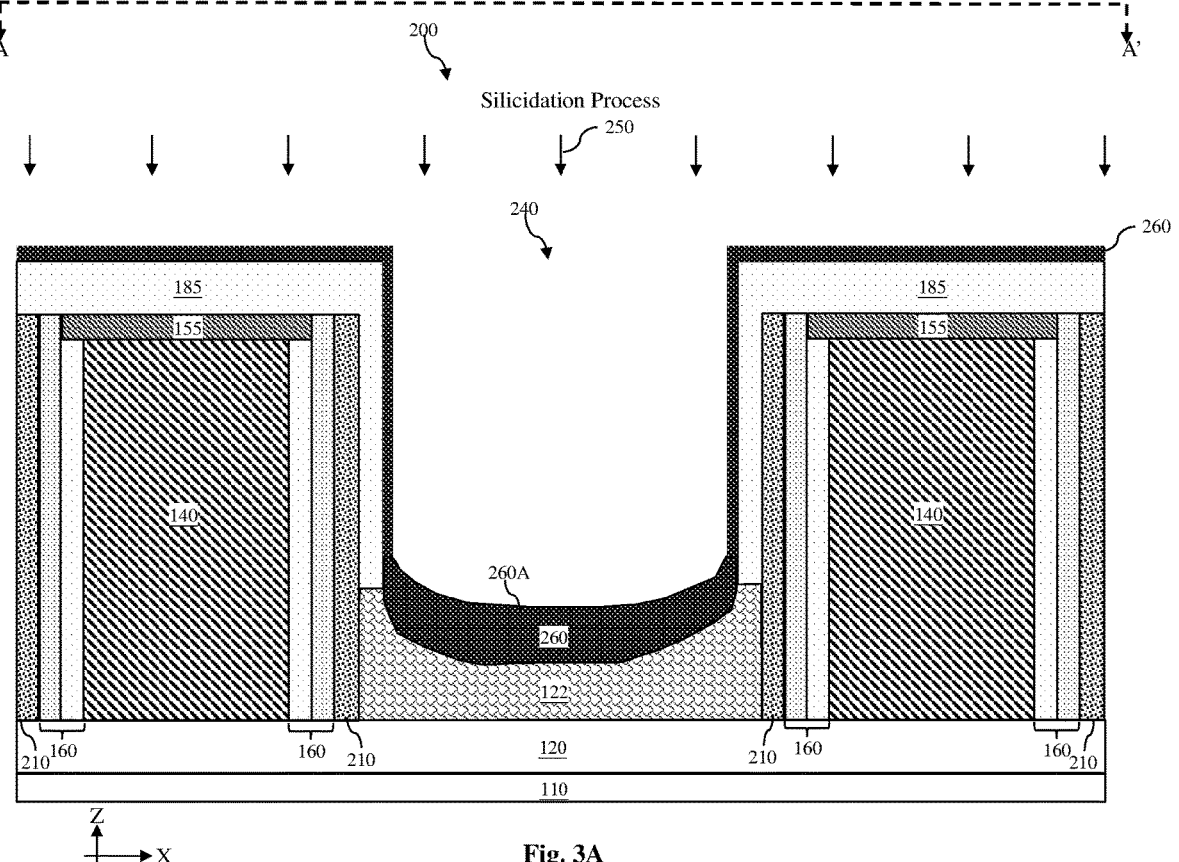
Figure 3B:
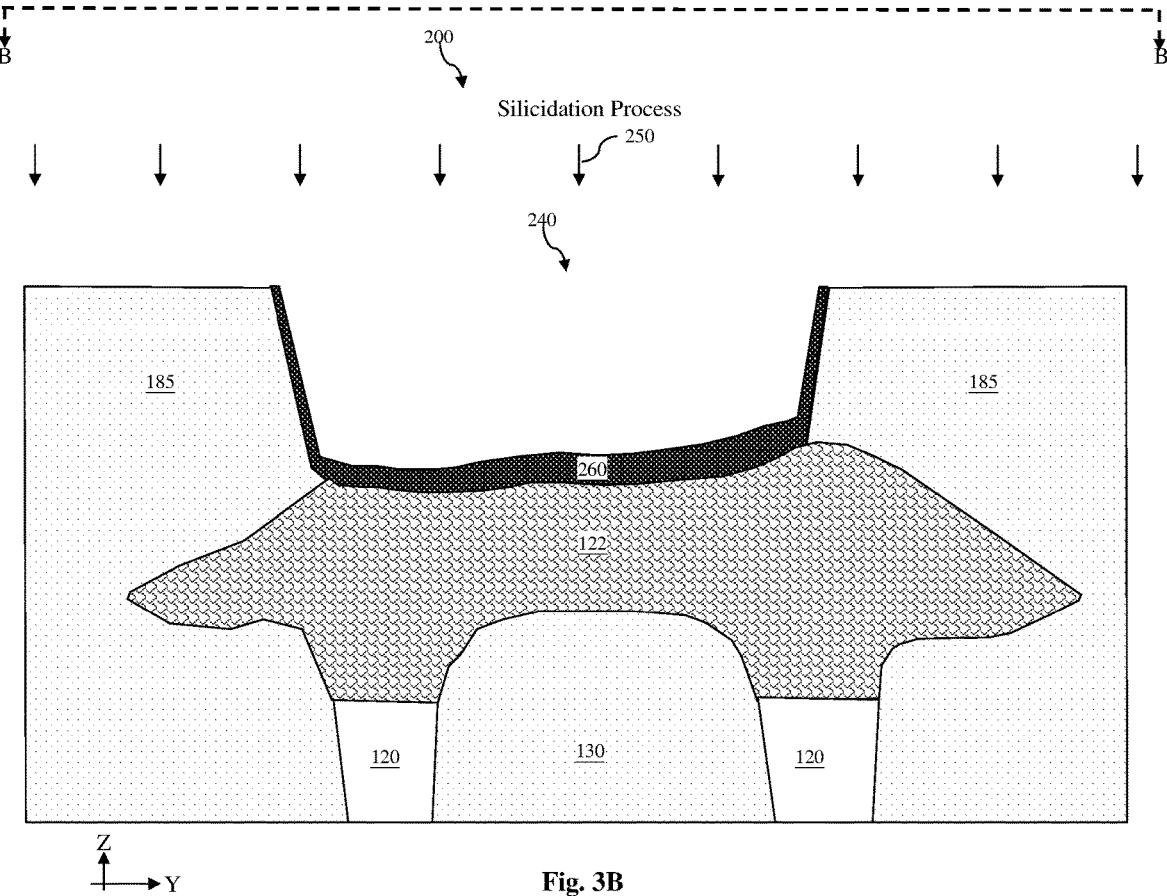

Referring now to FIGS. 3A-3B, a silicidation process 250 is performed to the IC device 200 to form a silicide layer 260 over the source/drain component 122. In some embodiments, the silicidation process 250 includes depositing a conductive material, such as titanium, on the exposed upper surface of the source/drain component 122 and the side surfaces of the ILD 185. The deposited conductive material reacts with silicon to form the silicide layer 260, for example, titanium silicide ($TiSi_x$, where x is a positive integer). Note that the silicide layer 260 may also have a recessed (or concave) upper surface 260A, as shown in FIG. 3A. In some embodiments, a thin passivation layer may also be formed over the silicide layer 260. For example, a thin titanium nitride layer may be formed on the silicide layer 260 to protect it from potential damage or contamination. For reasons of simplicity, such a passivation layer is not specifically illustrated herein.

Figure 4A:
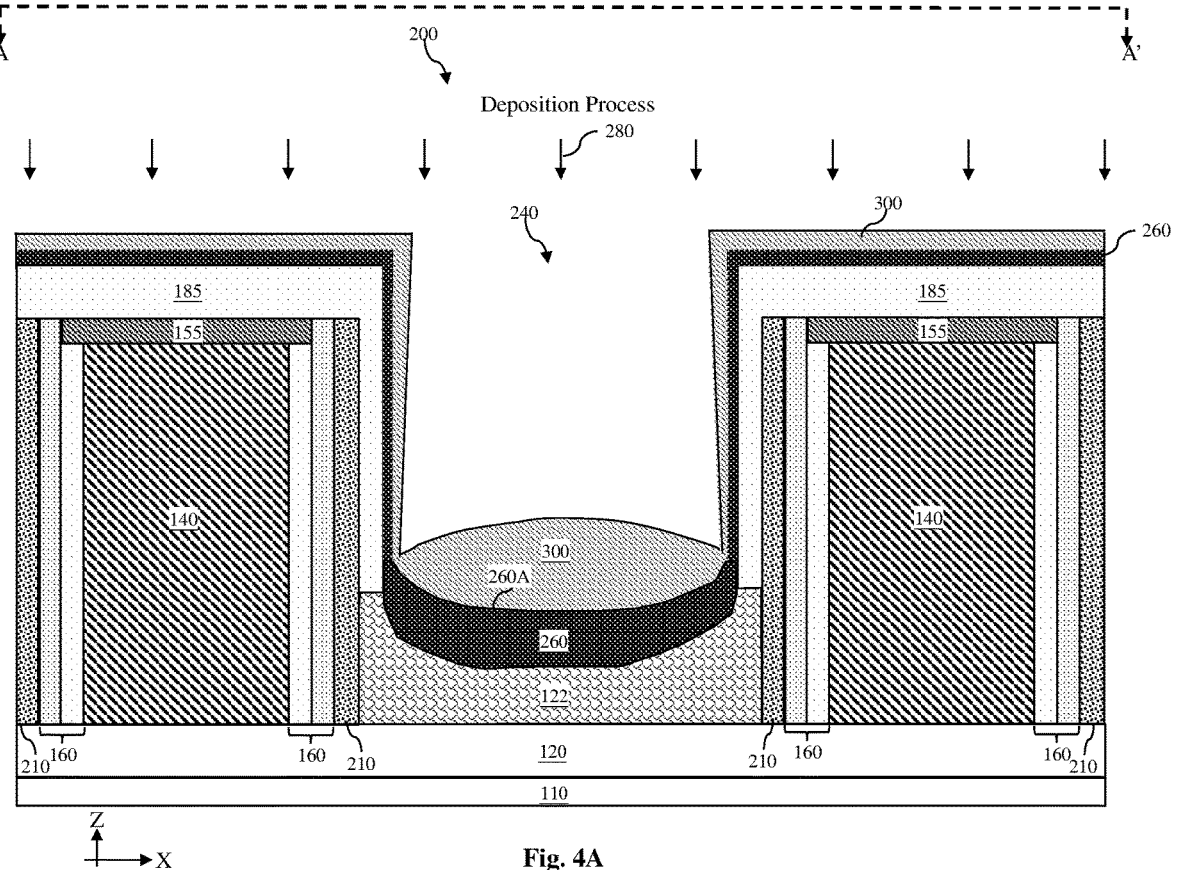
Figure 4B:
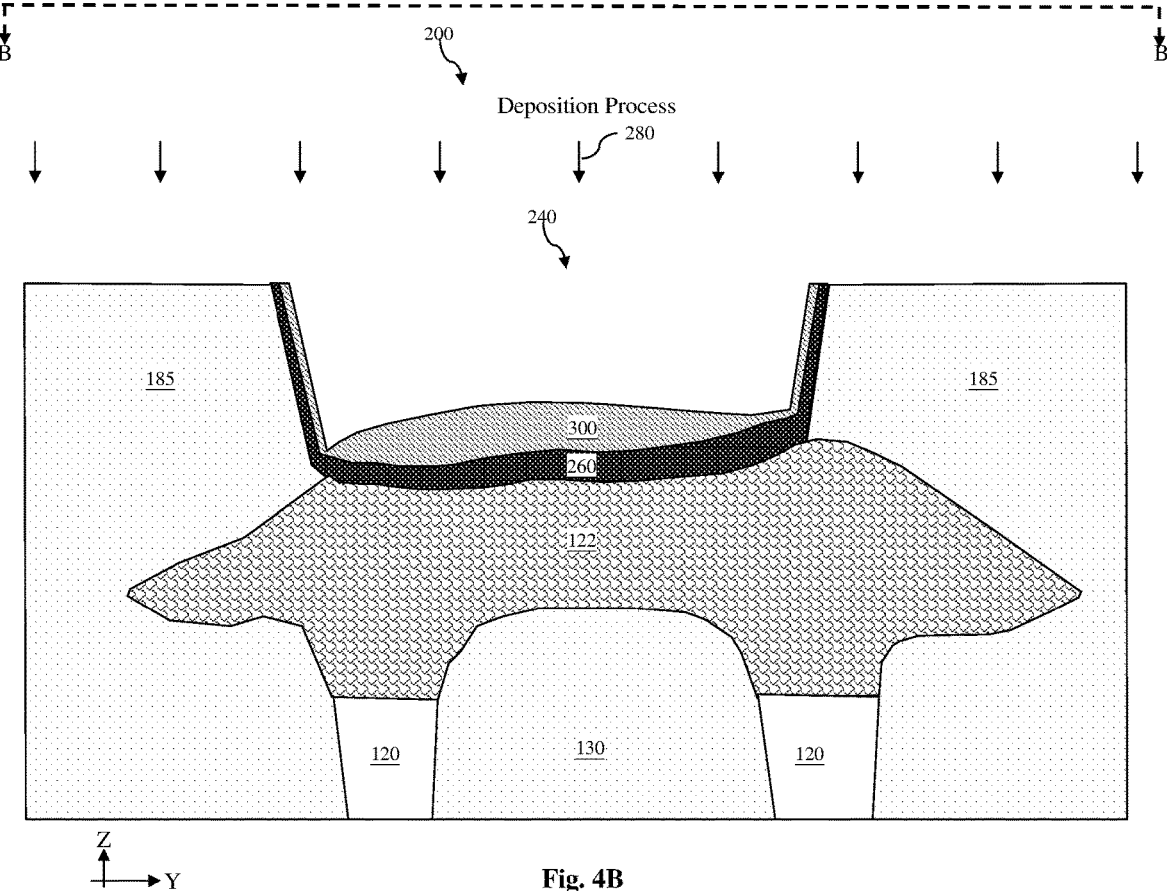

Referring now to FIGS. 4A-4B, a deposition process 280 is performed to the IC device 200 to form a conductive capping layer 300 over the silicide layer 260. Since the upper surface 260A of the silicide layer 260 is recessed, it inherently helps the conductive capping layer 300 to be deposited without trapping voids or bubbles therein. In some embodiments, the deposition process 280 includes a high-collimated physical vapor deposition (PVD) process. Such a high-collimated PVD process further enhances the gap filling performance of the conductive capping layer 300, for example, by carefully controlling the ion bombardment collimation from an ion plasma source. As a result, the conductive capping layer 300 can be formed without substantially trapping voids or gaps therein.

Another feature of such a collimated PVD process is that it forms thicker materials at the bottom but thinner materials on the sides. This is demonstrated in FIGS. 4A-4B, where a bottom portion of the conductive capping layer 300 (formed directly on the recessed surface 260A of the silicide layer 260) is substantially thicker than the side portions of the conductive capping layer (formed on the sidewalls of the silicide layer 260, which are themselves formed on the sidewalls of the ILD 185 that define the source/drain contact opening 240). Such an inherent result of the collimated PVD process allows the side portions and an upper portion of the conductive capping layer 300 to be removed in a later process, while still preserving a relatively thick bottom portion to serve as a conductive capping layer of a to-be-formed source/drain contact, as discussed below in more detail.

In some embodiments, the collimated PVD process (as an embodiment of the deposition process 280) deposits tungsten as the conductive capping layer 300. In other words, the conductive capping layer 300 includes a tungsten capping layer. In some embodiments, the collimated PVD process is performed with the following process parameters: a deposition time (or duration) in a range between about 20 seconds and 100 seconds, a radio frequency (RF) power in a range between about 1000 watts and about 5000 watts, and a process pressure in a range between about 200 milli-Torr and about 400 milli-Torr. These process parameters are not randomly chosen but are specifically configured to facilitate the void-free deposition of the conductive capping layer 300 into the source/drain contact opening 240.

Figure 5A:
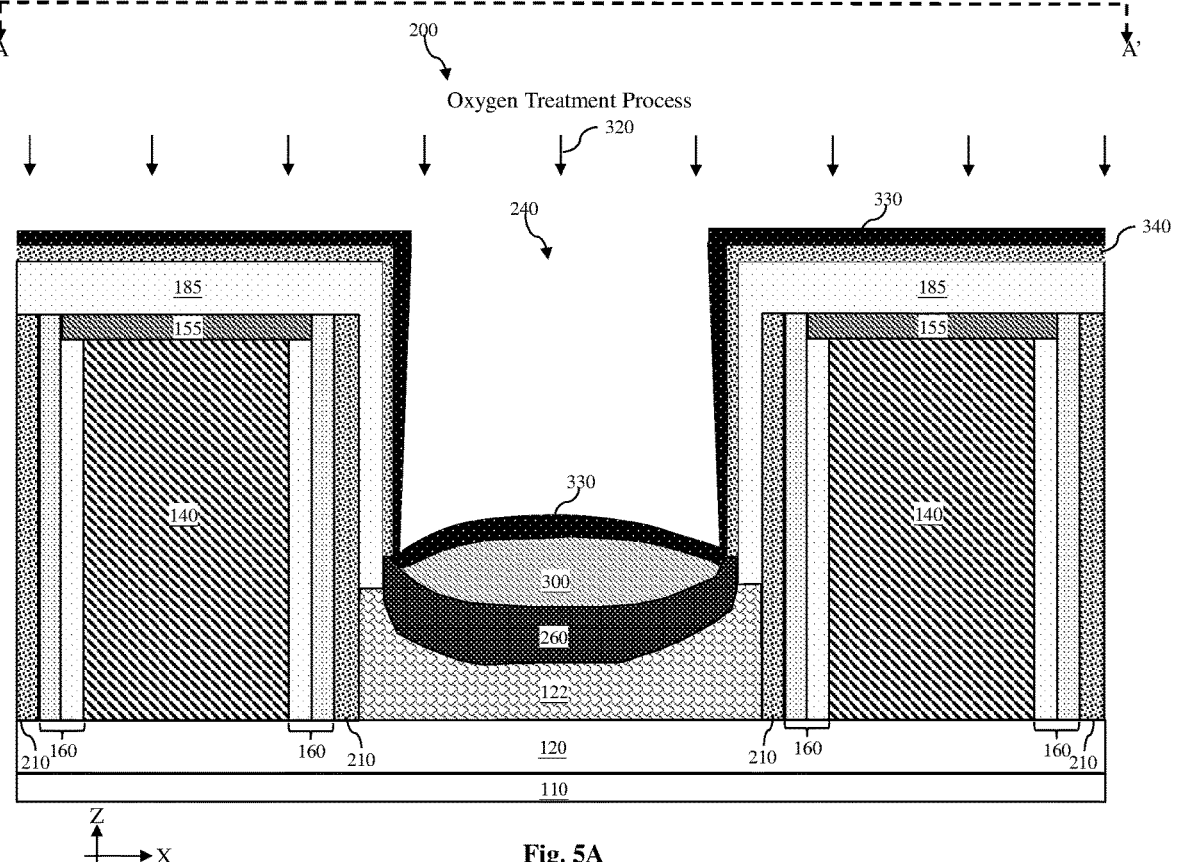
Figure 5B:
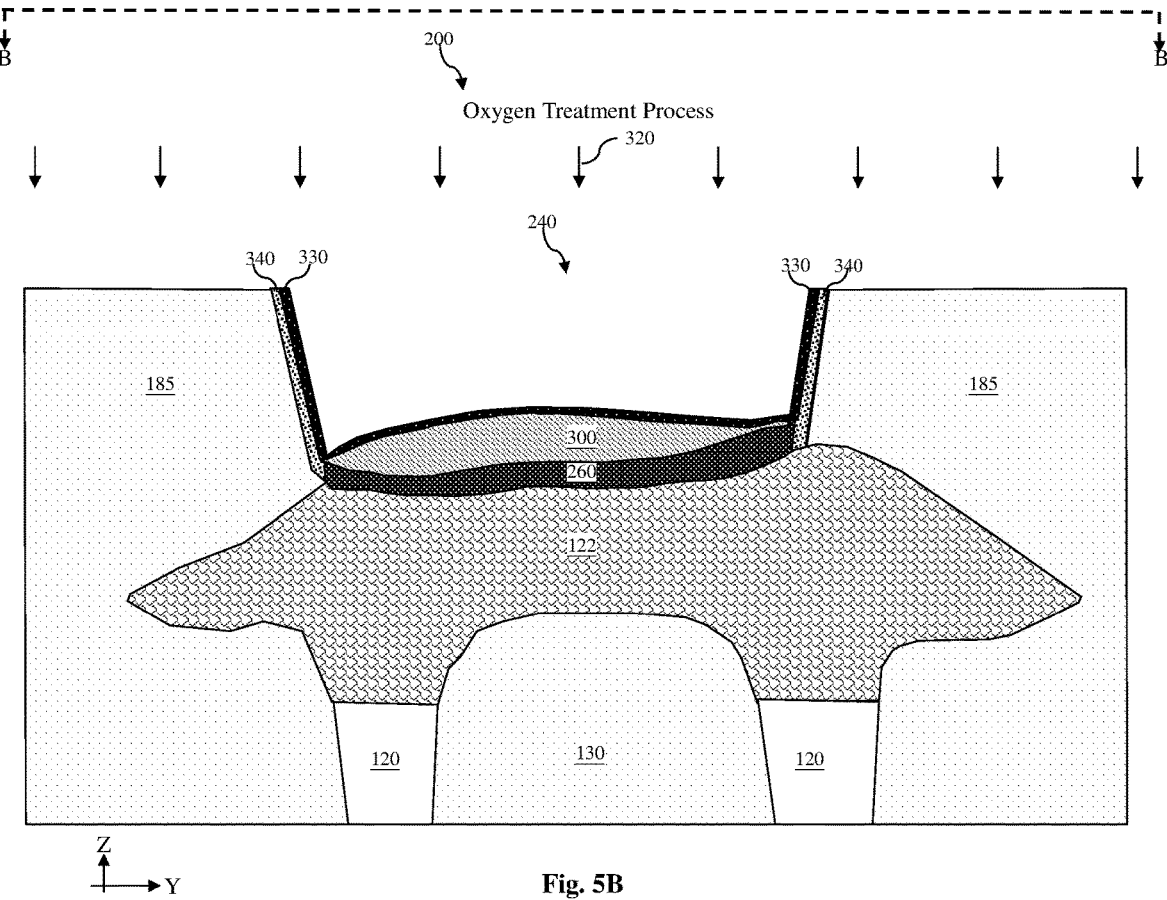

Referring now to FIGS. 5A-5B, an oxygen treatment process 320 is performed to the IC device 200 to form metal oxides. The oxygen treatment process 320 transforms an upper portion of the conductive capping layer 300 into a metal oxide layer 330. For example, in embodiments where the conductive capping layer 300 has a tungsten material composition, the oxygen treatment process 320 transforms the upper portion of the tungsten capping layer 300 into a tungsten oxide layer 330. Furthermore, the oxygen treatment process 320 transforms portions of the silicide layer 260 located on sidewalls and upper surfaces of the ILD 185 into a metal oxide layer 340. For example, in embodiments where the silicide layer 260 comprises titanium silicide, the oxygen treatment process 320 transforms the portions of the silicide layer 260 located on sidewalls and upper surfaces of the ILD 185 into a titanium oxide layer 340. Since the bottom portion (with the concave upper surface 260A) of the silicide layer 260 is protected by the relatively thick bottom portion of the conductive capping layer 300, the bottom portion of the silicide layer 260 is not transformed into the metal oxide layer 340. Note that the oxygen treatment process 320 also transforms the portions of the conductive capping layer 300 formed on the sidewalls and the upper surfaces of the metal oxide layer 340 into the metal oxide layer 330 as well.

In some embodiments, the oxygen treatment process 320 is performed with the following process parameters: a process temperature in a range between about 300 degrees Celsius and about 500 degrees Celsius, a process pressure in a range between about 10 Torr and about 30 Torr, and an oxygen gas flow rate in a range between about 500 standard cubic centimeters per minute (sccm) and about 1500 sccm. These process parameters are not randomly chosen but are specifically configured to fine-tune the oxidation of the portions of the conductive capping layer 300 and the silicide layer 260. For example, if the oxygen treatment process 320 is performed too aggressively, then the entirety of the conductive capping layer 300 (and/or the silicide layer 260 therebelow) may be at-risk of getting oxidize. Such a result would not have been desirable, since at least a portion of the conductive capping layer 300 needs to remain to serve as a bottom portion of the to-be-formed source/drain contact. On the other hand, if the oxygen treatment process 320 is not performed sufficiently, then it may not sufficiently oxidize the portions of the conductive layer 300 and the portions of the silicide layer 260 located on the sidewalls of the source/drain contact opening 240. Such a result also would not have been desirable, since their presence would have interfered with subsequent fabrication processes. The specifically-configured ranges of the process parameters of the oxygen treatment process 320 herein is optimized such that just the right amounts of the conductive capping layer 300 and the silicide layer 260 are oxidized, which facilitates the performance of the subsequent fabrication processes.

In some embodiments, the oxygen treatment process 320 may be optionally followed by a soaking process. In such an optional soaking process, a gas that contains tungsten and chlorine (e.g., a $WCl_x$ gas) may be used to soak the IC device 200. The gas may partially remove portions of the conductive capping layer 300 at the upper surface that have not been oxidized. For example, in some cases, the oxygen treatment process 320 may not fully oxidize an entire upper surface of the conductive capping layer 300, since the left and right corner regions of the conductive capping layer 300 may be hard for the oxygen to reach. However, it is desirable to remove these corner portions of the conductive capping layer 300 that should have been oxidized. Therefore, the soaking process with the $WCl_x$ gas may be used to remove these corner portions of the conductive capping layer 300. In some embodiments, the optional soaking process may be performed with a process duration between about 3 minutes and about 8 minutes, and with a process pressure between about 10 Torr and about 30 Torr.

It is understood that the oxygen treatment process 320 is one of the unique fabrication processing steps performed according to embodiments of the present disclosure, but it is not performed in conventional fabrication processing flows.

Figure 6A:
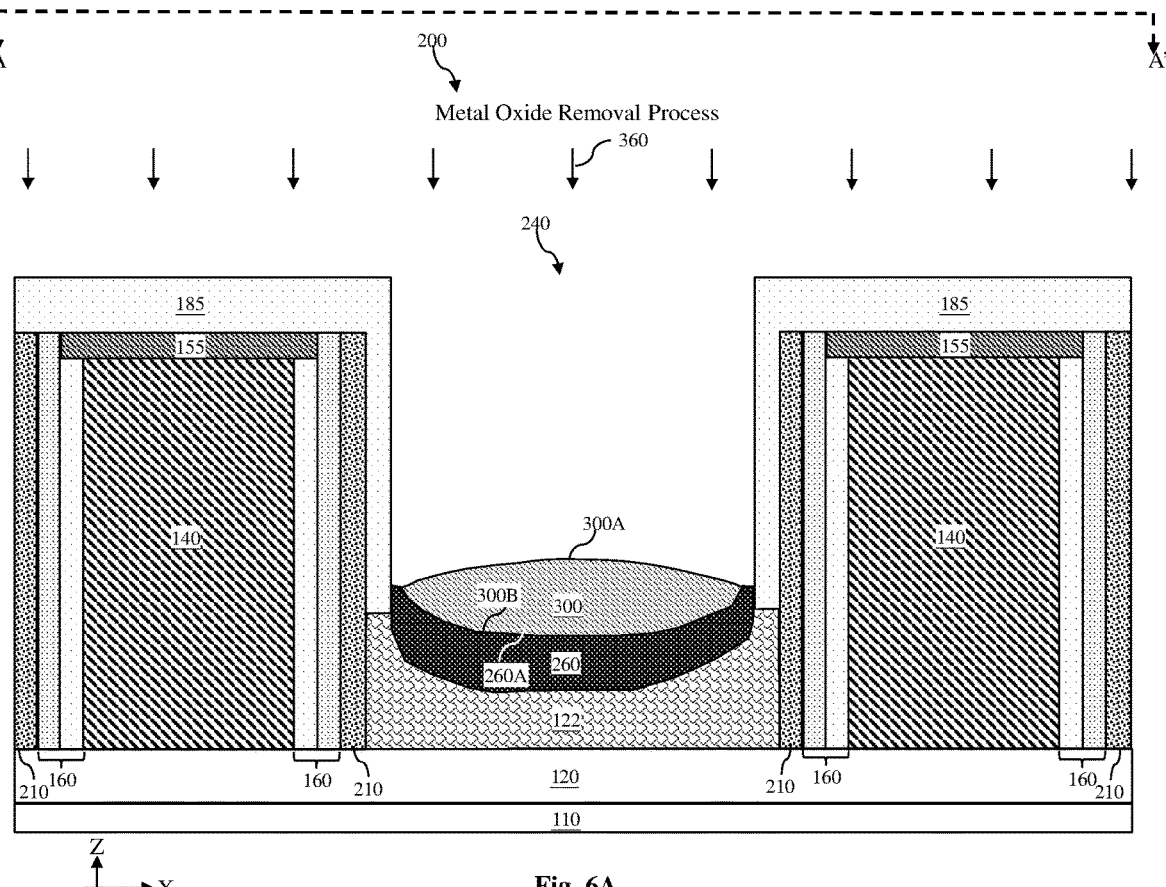
Figure 6B:
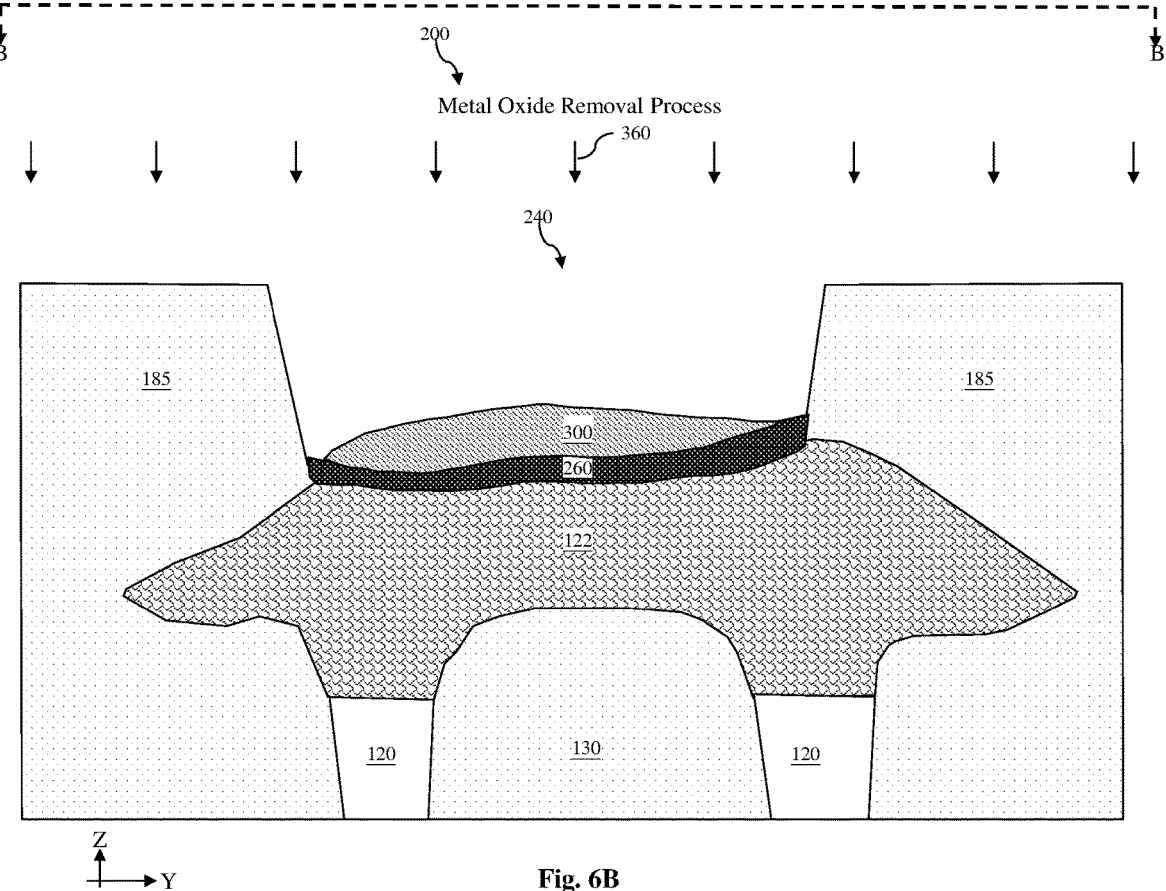

Referring now to FIGS. 6A-6B, a metal oxide removal process 360 is performed to the IC device 200 to remove the metal oxide layers 330 and 340, which exposes the conductive capping layer 300 and partially exposes the corner tip regions of the silicide layer 260. In some embodiments, the metal oxide removal process 360 includes one or more etching processes, which may include wet etching processes, dry etching processes, or combinations thereof. The etching processes may be configured such that the conductive capping layer 300 and the ILD 185 have an etching selectivity with the metal oxide layers 330 and 340. For example, the etchant or other etching process parameters of the etching processes are configured to etch away the metal oxide layers 330 and 340 at substantially greater rates (e.g., 10 times or more) than the conductive capping layer 300 or the ILD 185, which facilitates the removal of the metal oxide layers 330 and 340 without substantially affecting the conductive capping layer 300 or the ILD 185.

After the removal of the metal oxide layers 330 and 340, an upper surface 300A of the remaining portion of the conductive capping layer 300 also has a convex shape (upwardly protruding and rounded) in the X-cut cross-sectional view of FIG. 6A, though such a convex shape is less obvious in the Y-cut cross-sectional view of FIG. 6B. Since a bottom surface 300B of the bottom portion of the conductive capping layer 300 coincides with the upper surface 260A of the silicide layer 260, the bottom surface 300B is also convex from the perspective of the conductive capping layer 300. In other words, the bottom portion of the conductive capping layer 300 has both a convex upper surface 300A and a convex bottom surface 300B in FIG. 6A, which makes its X-cut cross-sectional profile resemble the profile of an ellipse, or an American football. In some embodiments, a perimeter (which may be approximately equal to a sum of the lengths of the convex upper surface 300A and the convex bottom surface 300B) of the remaining portion of the conductive capping layer 300 in FIG. 6A is in a range between about 10 nanometers and about 30 nanometers.

Note that, had the metal oxide layers 330 and 340 not been formed and then subsequently removed, the resulting device may have defects. For example, suppose that no oxygen treatment process was performed to transform portions of the conductive capping layer 300 and the silicide layer 260 into the metal oxide layers 330 and 340, respectively. This means that etching processes would have to be performed to remove portions of the conductive capping layer 300 and the silicide layer 260 located on sidewalls and upper surfaces of the ILD 185, without substantially etching the bottom portions of the conductive capping layer 300 and the silicide layer 260 located at the bottom of the source/drain contact opening 240. No etching selectivity can be configured in such a scenario, which could lead to either under-etching of the portions of the conductive capping layer 300 and the silicide layer 260 located on sidewalls and upper surfaces of the ILD 185, or over-etching of the portions of the conductive capping layer 300 and the silicide layer 260 located at the bottom of the source/drain contact opening 240. Neither of these outcomes is desirable. The present disclosure avoids these undesirable outcomes by oxidizing the conductive capping layer 300 and the silicide layer 260 into metal oxide layers 330 and 340, respectively, which allows for etching selectivities to be configured to facilitate the removal of the metal oxide layers 330 and 340 while preserving the conductive capping layer 300 and the silicide layer 260 as desired. In other words, an inherent result of the fabrication processes discussed above being performed is that undesirable layers are removed from the sidewalls of the source/drain contact opening 240, while the remaining portion of the conductive layer 300 achieves a desired profile (e.g., a rounded upper surface 300A).

Figure 7A:
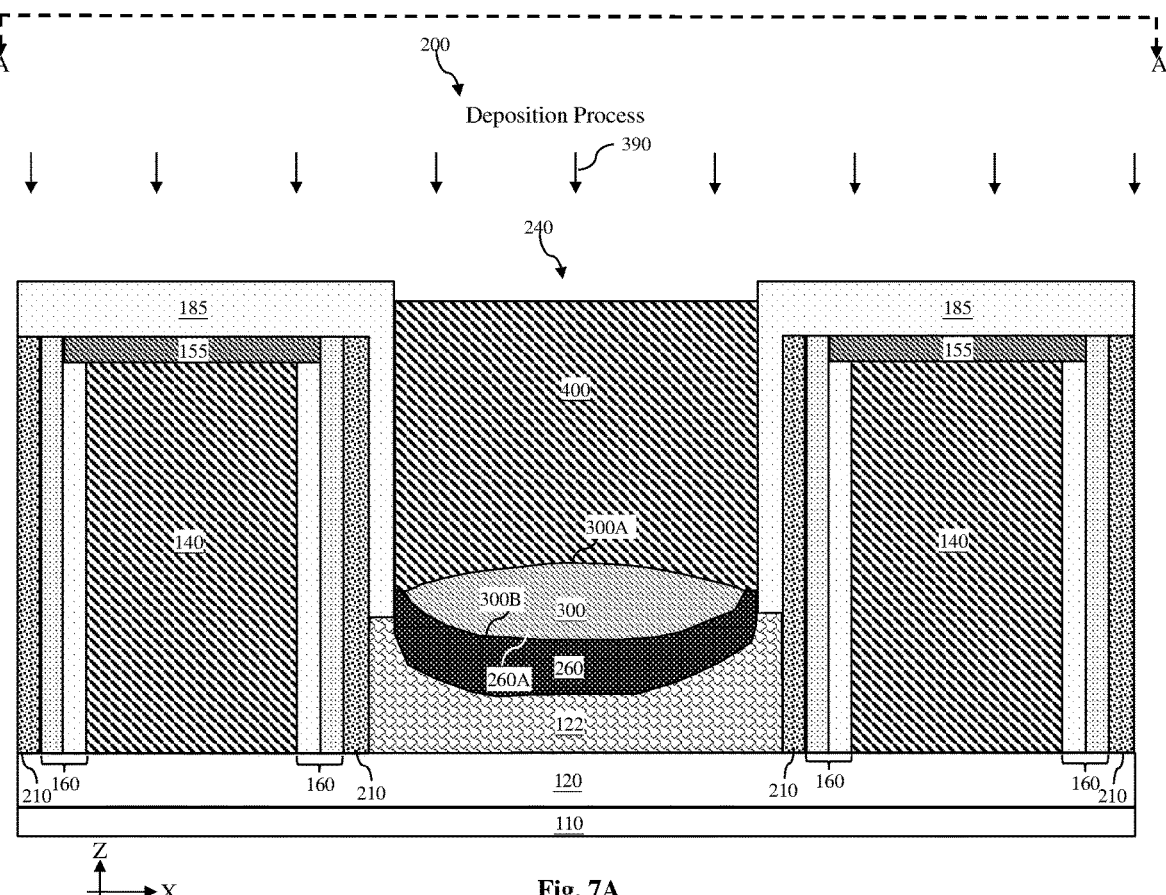
Figure 7B:
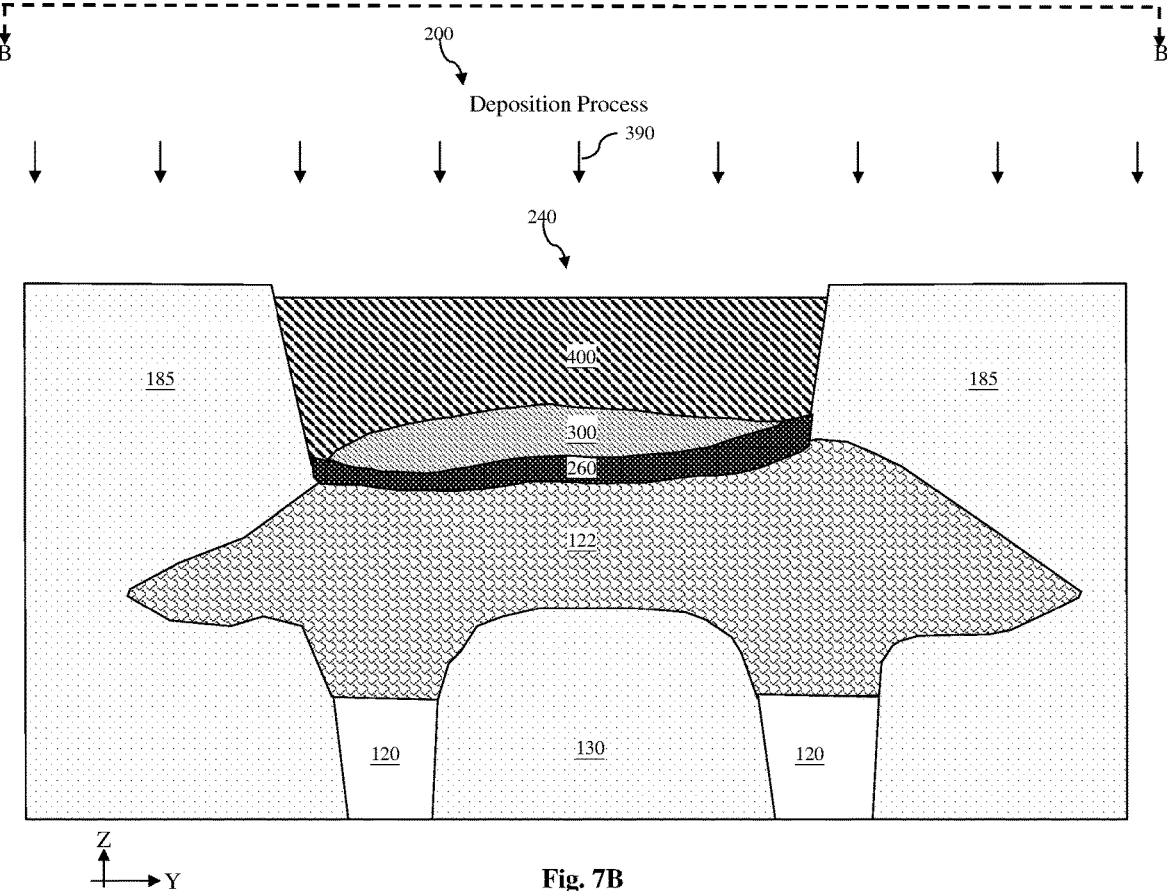

Referring now to FIGS. 7A-7B, a deposition process 390 is performed to the IC device 200 to deposit a conductive material 400 that fills a substantial majority of the source/drain contact opening 240. The conductive material 400 is deposited directly on the convex upper surface 300A of the conductive capping layer 300. As such, the convex upper surface 300A of the conductive capping layer 300 may also be considered a recessed (or concave) bottom surface 300A of the conductive material 400. In other words, the surface 300A may be interchangeably referred to as either a convex upper surface of the conductive capping layer 300 or a concave bottom surface of the conductive material 400.

Since a portion of the source/drain contact opening 240 is already filled by the conductive capping layer 300, the aspect ratio (e.g., a ratio of a height versus width) of the source/drain contact opening 240 is inherently reduced by the time the deposition process 390 is performed. The reduced aspect ratio also allows the conductive material 400 to fill the source/drain contact opening 240 more easily, which reduces the possibility of trapping voids or gaps in the conductive material 400. Since the conductive material 400 constitutes a majority portion of the source/drain contact, the parasitic resistance of the source/drain contact is reduced, and the performance (e.g., speed or power consumption) of the IC device 200 is improved.

In some embodiments, the deposition process 390 includes a chemical vapor deposition (CVD) process. In some embodiments, the CVD process of the deposition process 390 may deposit molybdenum (Mo) as the conductive material 400 into the source/drain contact opening 240 and on the conductive capping layer 300. For example, Mo may be deposited using molybdenum chloride ($MoCl_x$, where x is a positive integer) as a precursor. Such a CVD process with the $MoCl_x$ as its precursor has improved gap filling performance compared to conventional deposition processes, for example, PVD processes. As such, the resulting conductive material 400 can fill the source/drain contact opening 240 without substantially trapping voids or gaps therein, even if the aspect of the ratio of the source/drain contact opening 240 had not been improved (e.g., reduced) by the prior deposition of the conductive capping layer 300 in the opening.

It is understood that, since the precursor contains chlorine (Cl), the deposited conductive material 400 may have a machine-detectable presence of Cl, especially at an edge of interface with the ILD 185. Such a presence of Cl is an inherent result of the specific deposition process being performed herein, and it serve as physical evidence that an IC device has been fabricated using the unique process flow of the present disclosure.

Note that, although most of the conductive material 400 is deposited directly on the upper surface 300A of the conductive capping layer 300, a small portion of the conductive material 400 is also deposited on the corner tips of the silicide layer 260. In other words, the conductive material 400 is in direct contact with both the conductive capping layer 300 and the silicide layer 260.

As discussed above, the conductive material 400 and the conductive capping layer 300 therebelow may collectively form a sourced/drain contact that provides electrical access to the source/drain component 122. Aside from the substantial reduction in voids or bubble in such a source/drain contact, the direct physical contact between the conductive material 400 (e.g., Mo) and the convex upper surface 300A of the conductive capping layer 300 can also effectively reduce the parasitic resistance of the source/drain contact. In more detail, although W (used to implement the conductive capping layer 300 in the illustrated embodiment) and Mo (used to implement the conductive material 400 in the illustrated embodiment) are both electrically conductive, Mo still has a greater conductivity and/or lower resistivity than W. As such, it is desirable for the Mo to form as great of an interface as possible with the W below. Here, by ensuring that the upper surface 300A of the conductive capping layer 300 has a curved profile, the interface area between the Mo (of the conductive material 400) and the W (of the conductive capping layer 300) is lengthened, which allows the lower resistivity of the Mo (of the conductive material 400) to dominate the overall resistance of the source/drain contact. Had the upper surface of the conductive capping layer 300 been flat, it would have led to a smaller interface area between the conductive material 400 and the conductive capping layer 300, which would not have reduced the resistance of the source/drain contact. Therefore, the formation of the conductive material (e.g., Mo) directly on the upwardly protruding and rounded upper surface 300A of the conductive capping layer 300 herein is one of the unique physical characteristics of the present disclosure, and the reduction in parasitic resistance is also an inherent result of the structural configuration of the source/drain contact herein.

Another unique physical characteristic of the present disclosure is that the conductive material 400 is formed to be in direct physical contact with the sidewalls of the ILD 185. In other words, the conductive material 400 is formed without using a glue layer or a barrier layer. This is at least in part due to the fact that Mo is not easily diffused into surrounding materials, for example, into the neighboring HKMG structures 140. As such, no glue layer or barrier layer needs to surround the conductive material 400 to prevent it from diffusing into the neighboring HKMG structures 140. The lack of glue layers or barrier layers to surround the conductive material 400 further improves the effective aspect ratio of the source/drain contact opening 240, since the effective width is increased compared to other implementations where glue layers or barrier layers (which reduce the width of the source/drain contact opening) are first formed in the source/drain contact opening. Therefore, the fact that the conductive material 400 can be formed in direct contact with the sidewalls of the ILD 195—which is an inherent result of the fabrication process flow being performed herein—further helps to improve the gap filling performance of the deposition process 390, which further reduces the likelihood of voids or bubbles in the as-formed conductive material 400.

Figure 8A:
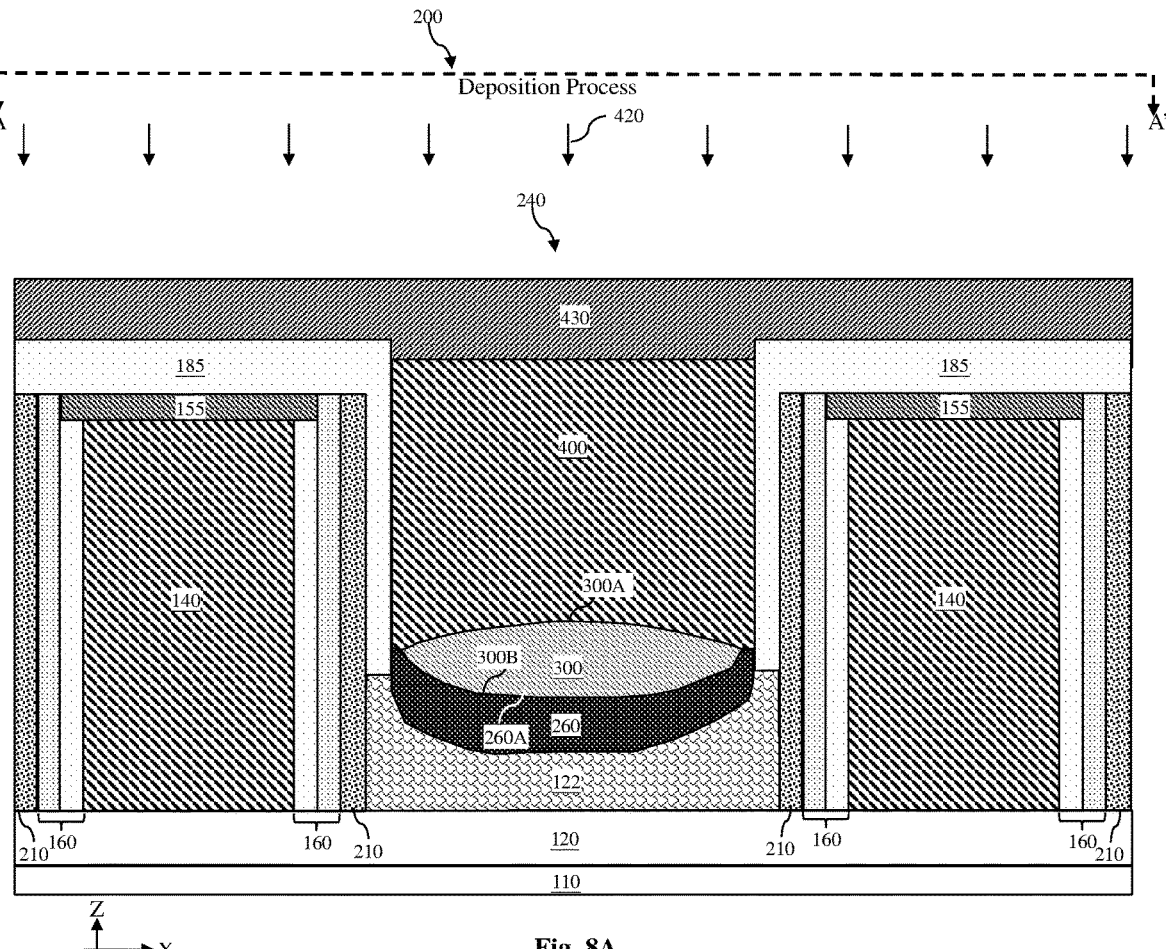
Figure 8B:
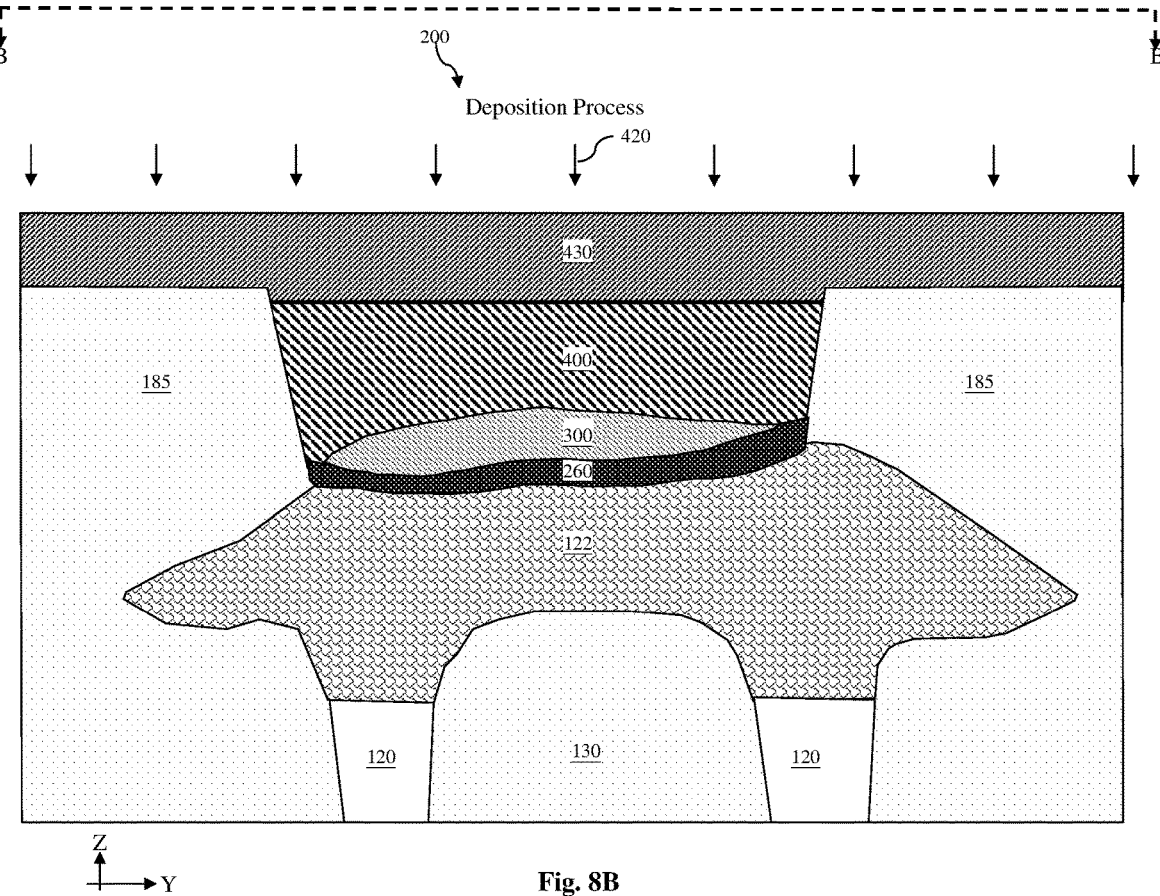

Referring now to FIGS. 8A-8B, a deposition process 420 is performed to the IC device 200 to form another conductive material 430 over the conductive material 400 and over the upper surfaces of the ILD 185. In some embodiments, the deposition process 420 includes a bulk CVD process, in which W is deposited as the conductive material 430. The conductive material 430 completely fills the source/drain contact opening 240. The conductive material 430 will be used as a sacrificial layer and will be removed in a later process.

Figure 9A:
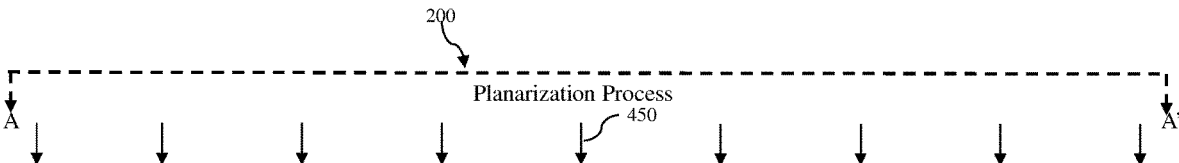
Figure 9A:
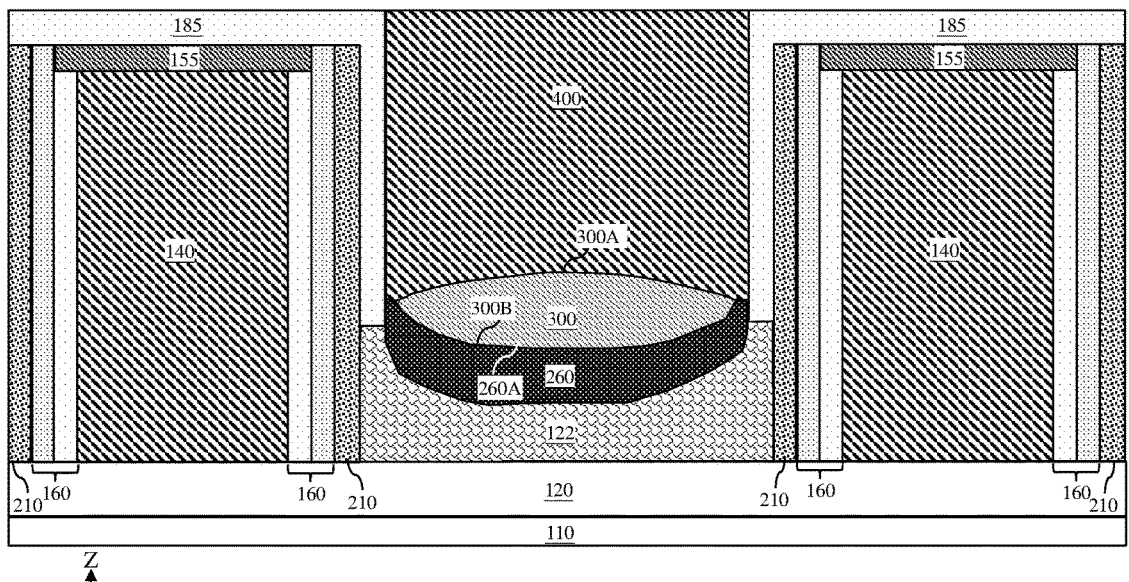
Figure 9B:
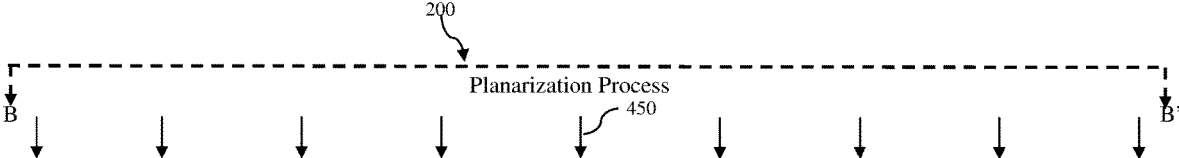
Figure 9B:
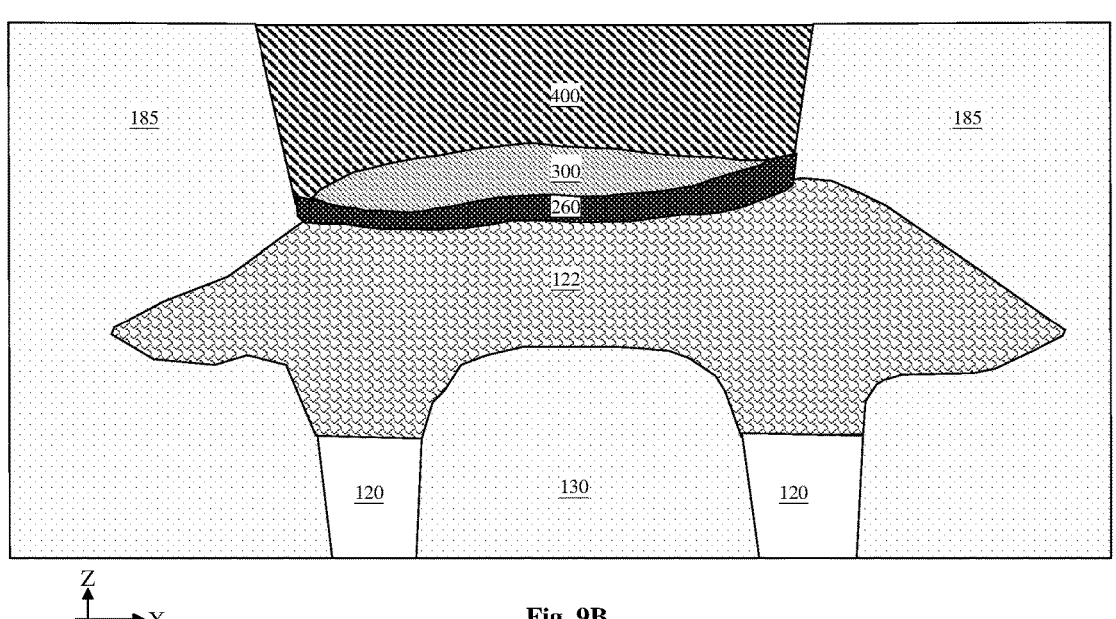

Referring now to FIGS. 9A-9B, a planarization process 450 is performed to the IC device 200 to remove the conductive material 400 and portions of the ILD 185. In some embodiments, the planarization process 450 includes a chemical mechanical polishing (CMP) process, which may etch and grind away portions of the conductive material 400 and the ILD 185 until the upper surface of the conductive material 400 is exposed. At the end of the planarization process 450, the conductive material 400 and the ILD 185 may have substantially flat and co-planar upper surfaces. Again, the conductive material 400 and the conductive capping layer 300 (and optionally, the silicide layer 260) collectively form a source/drain contact that provides electrical connectivity to the source/drain component 122. As discussed above, the unique fabrication process flows performed herein inherently results in the uniquely structured source/drain contact, which has reduced resistance at least in part due to the substantial reduction or elimination of voids or gaps therein, and also least in part due to the rounded (convex or concave, depending on the perspective) interface area between the conductive material 400 and the conductive capping layer 300.

Figure 10A:
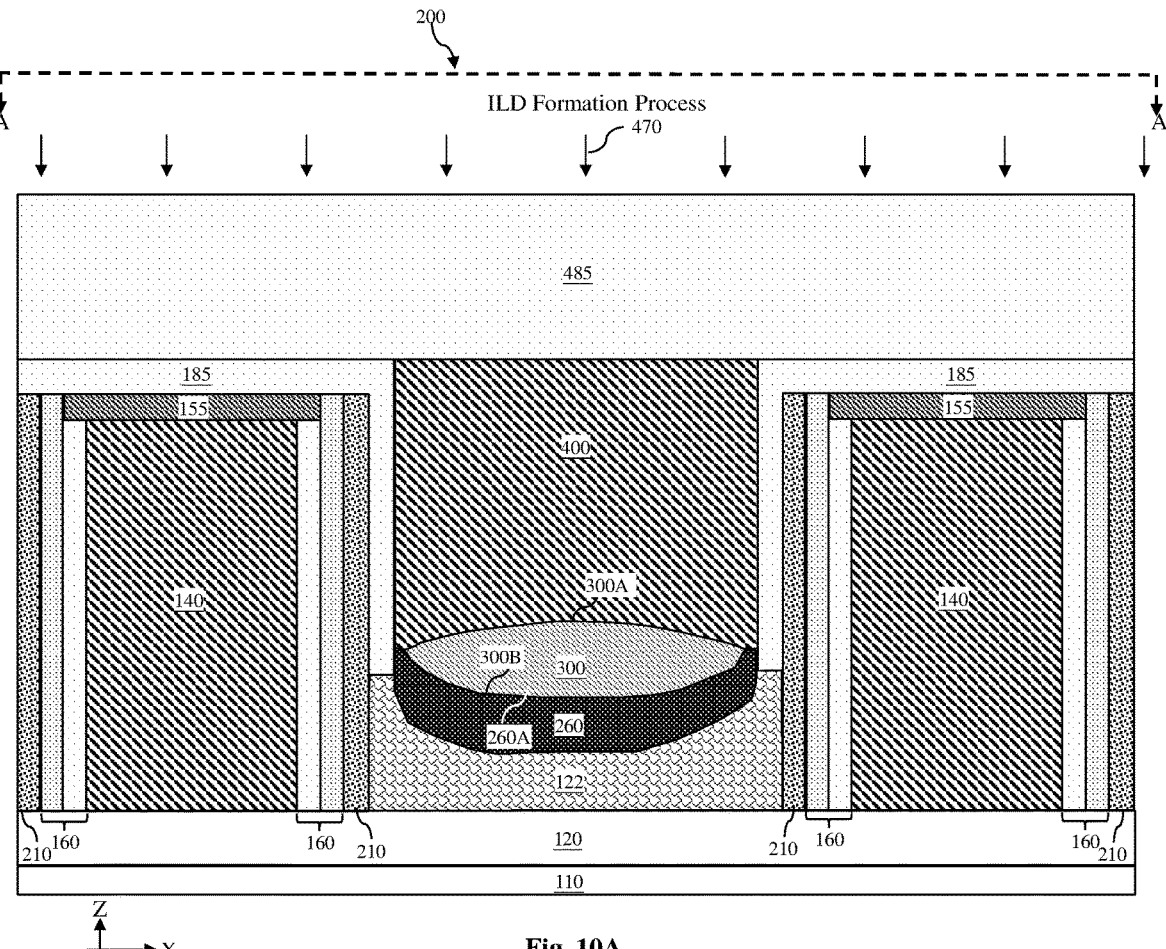
Figure 10B:
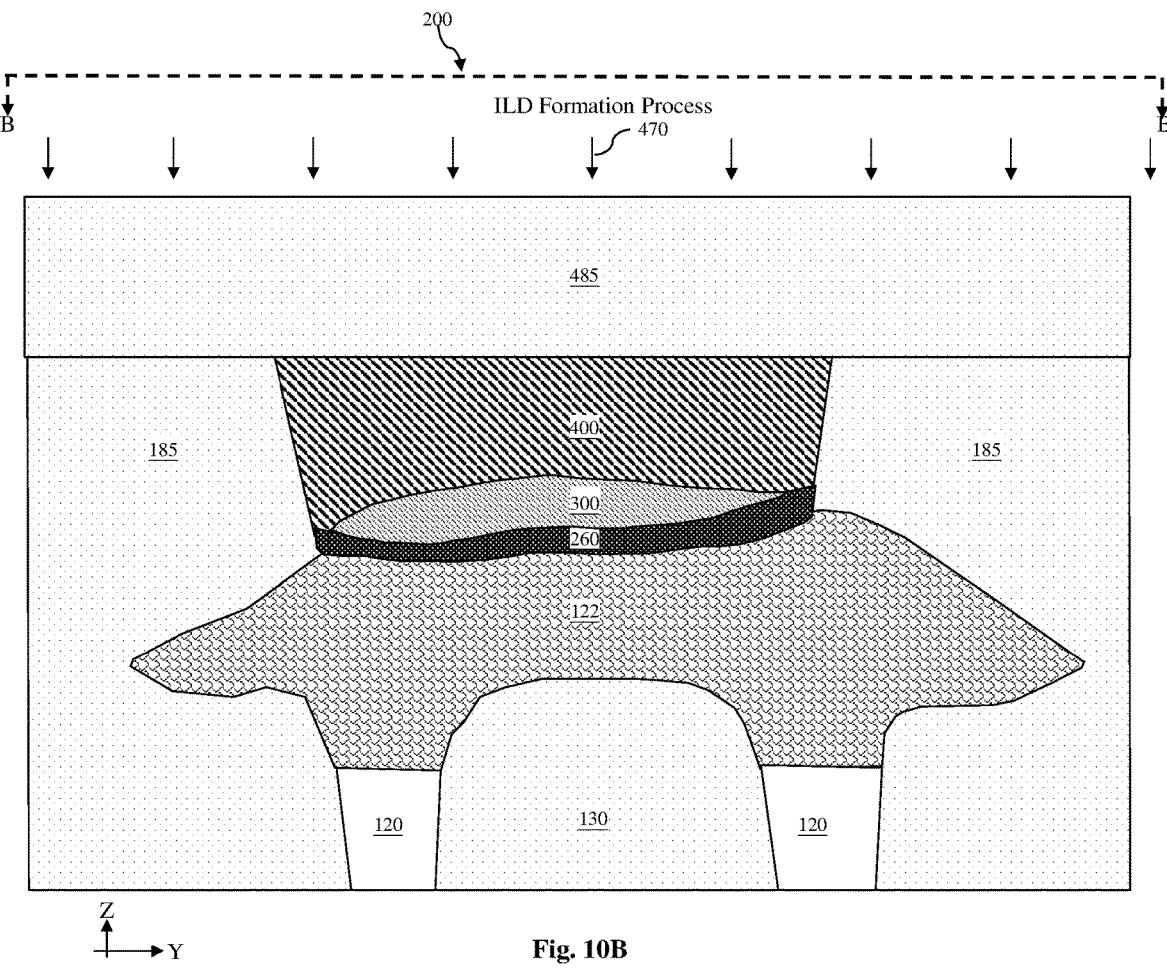

Referring now to FIGS. 10A-10B, an ILD formation process 470 may be performed to form an ILD 485 over the planarized upper surfaces of the conductive material 400 and the ILD 185. In some embodiments, the ILD formation process 470 may include one or more deposition processes to deposit an electrically insulating material (e.g., a dielectric material). The ILD 485 may also be referred to as an ILD1 layer, since it is located one level above the ILD 185

(which may be the ILD0 layer in this case). In some embodiments, the ILD 485 may include silicon oxide, silicon nitride, or a low-k dielectric material. The ILD 485 and the ILD 185 may have a same material composition in some embodiments, or different material compositions in other embodiments.

Figure 11A:
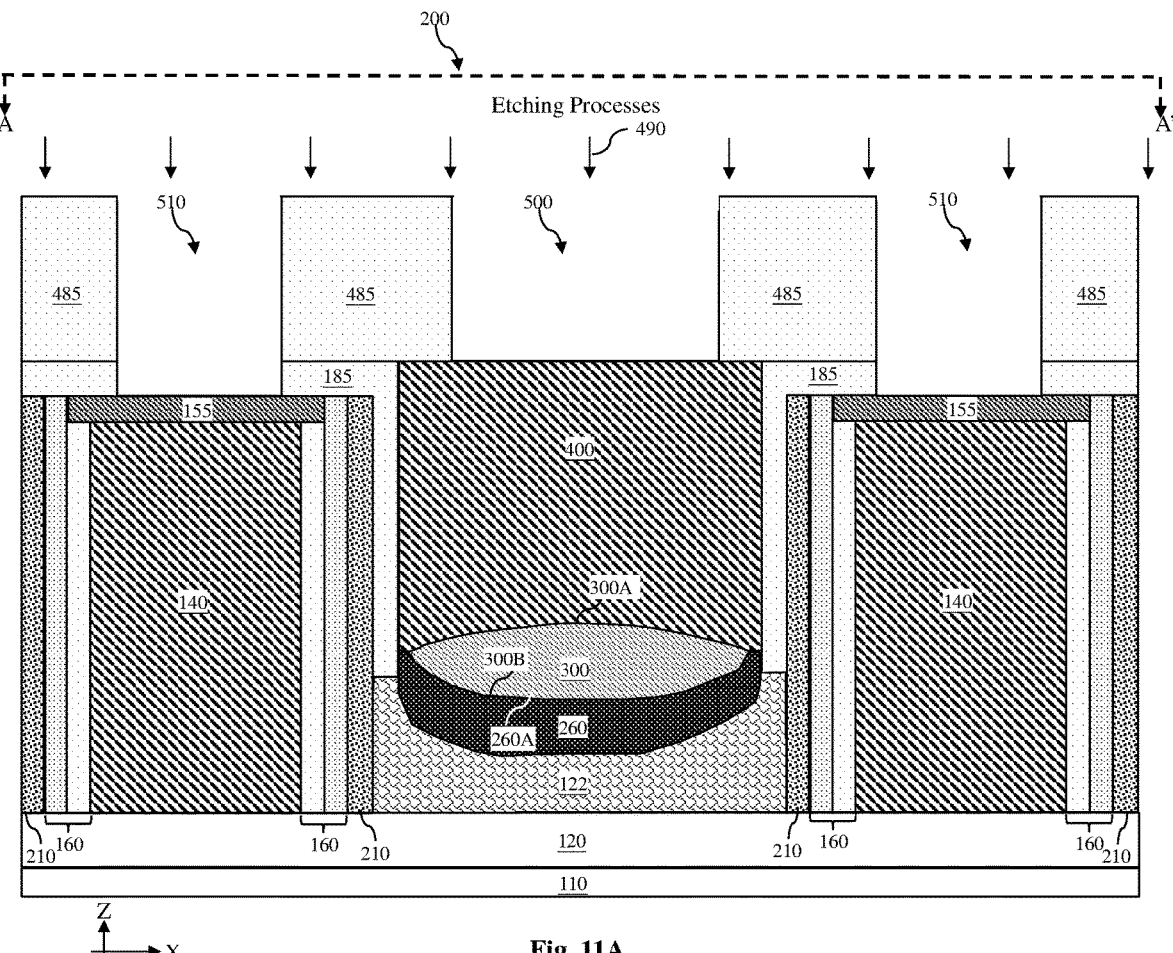
Figure 11B:
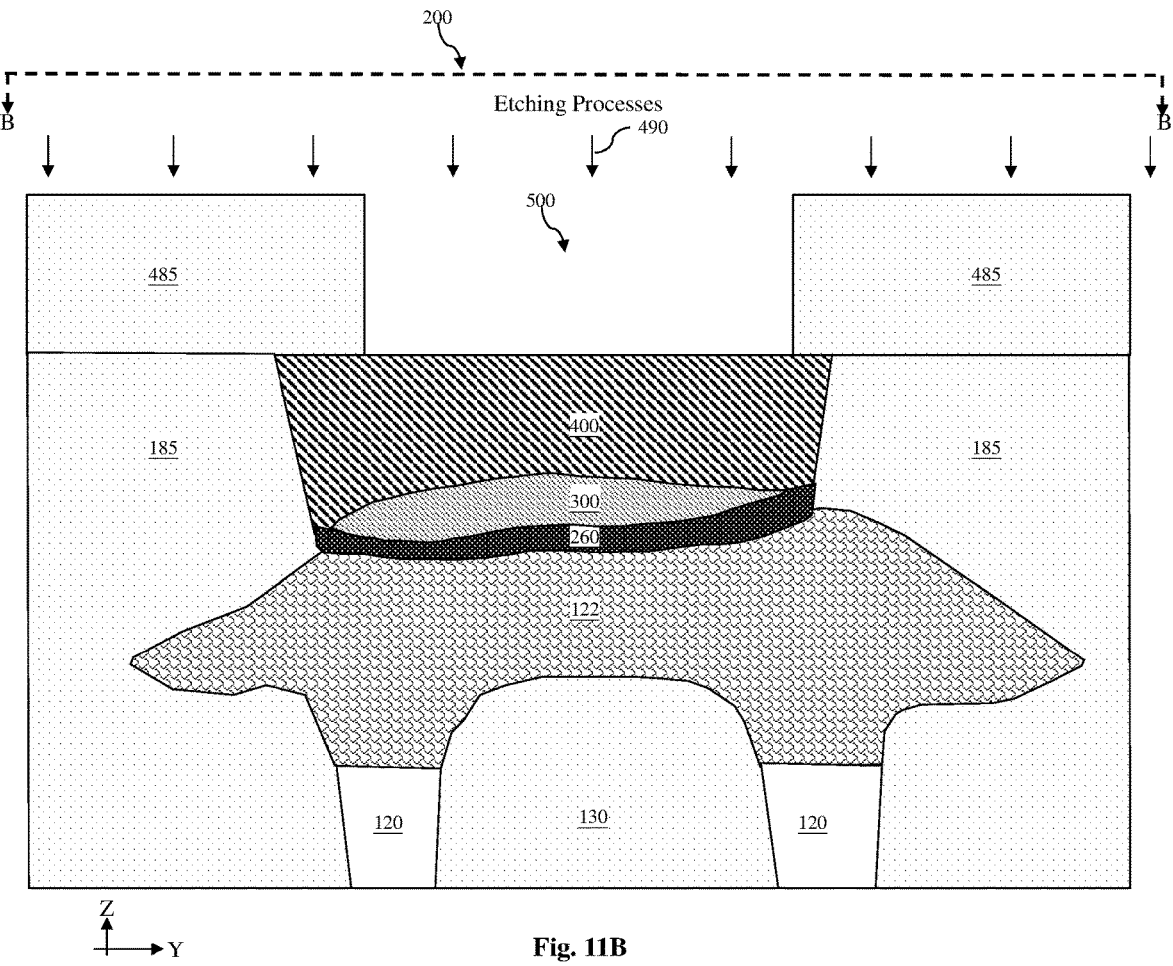

Referring now to FIGS. 11A-11B, one or more etching processes 490 may be performed to form via openings, for example, a source/drain via opening 500 and gate via openings 510. In various embodiments, the one or more etching processes 490 may include wet etching processes, dry etching processes, or combinations thereof. The source/drain via opening 500 extends vertically through the ILD 485 and at least partially exposes an upper surface of the conductive material 400. The gate via openings 510 each extend vertically through the ILD 485 and the ILD 185 and at least partially expose an upper surface of a respective layer 155.

Figure 12A:
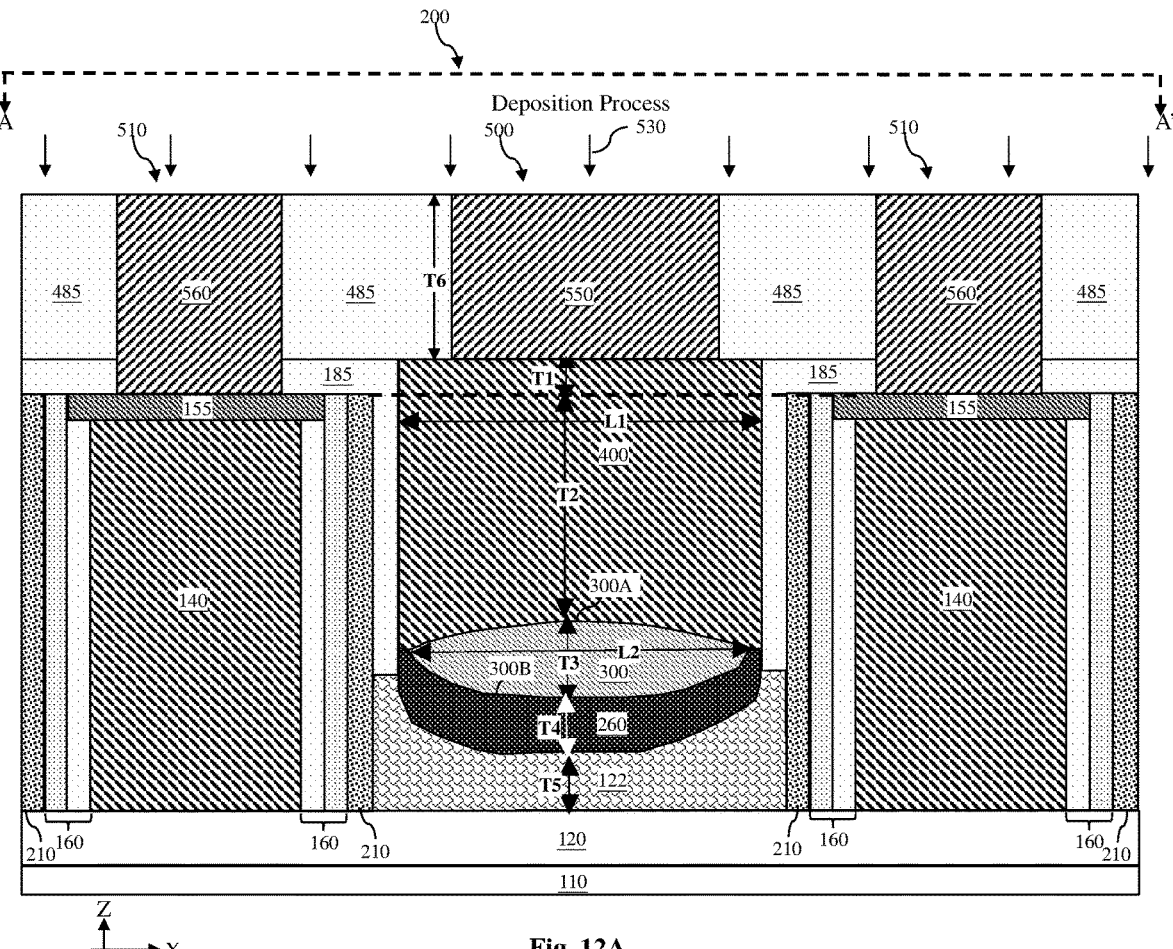
Figure 12B:
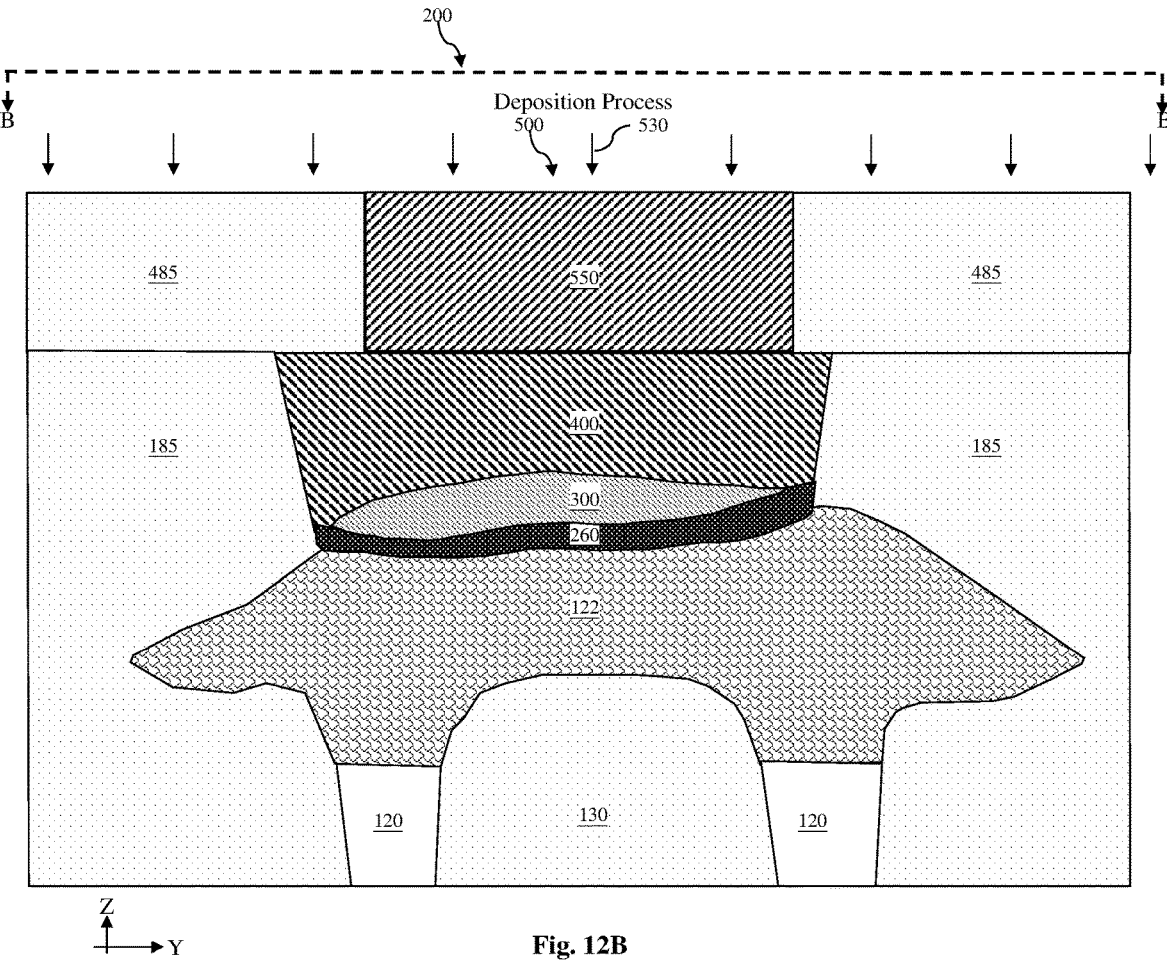

Referring now to FIGS. 12A-12B, a deposition process 530 is performed to form a source/drain via 550 in the source/drain via opening 500 and to form gate vias 560 in the gate via openings 510. The deposition process 530 may include a CVD process, a PVD process, an atomic layer deposition (ALD) process, or combination thereof, which may be used to deposit a conductive material into the source/drain via opening 500 and the gate via openings 510. In some embodiments, the deposited conductive material may include tungsten, which allows the source/drain via 550 to form a tungsten-molybdenum interface with the conductive material 400 below. In some embodiments, a length of such an interface (in the X-direction) is in a range between about 5 nanometers and about 10 nanometers. In other embodiments, the deposited conductive material may include molybdenum, aluminum, cobalt, ruthenium, titanium, or combinations thereof.

It is understood that a planarization process, such as a CMP process, may be performed to planarize the upper surfaces of the source/drain via 550 and the gate vias 560. Thereafter, additional metallization layers may be formed over the planarize the upper surfaces of the source/drain via 550 and the gate vias 560. For example, a lowest metal layer (e.g., a metal-0 layer) of a multi-level interconnect structure may be formed, where one or more metal line in the lowest metal layer may be electrically connected to the source/drain vias 550 and/or the gate vias 560. For reasons of simplicity, these additional metallization layers are not specifically illustrated herein.

Since the source/drain via 550 is formed using a separate lithography process after the formation of the source/drain contact (which includes the conductive material 400, the conductive capping layer 300, and optionally the silicide layer 260), there is a landing concern between the source/drain via 550 and the source/drain contact below. In other words, if the source/drain via opening 500 had not been aligned with the conductive material 400 with sufficient accuracy, it could lead to an undesirable lateral shift (e.g., in the X-direction) of the resulting source/drain via 550 with respect to the conductive material 400 below. If such a lateral shift is too great, it could even lead to electrical shorting between the source/drain via 550 and a neighboring gate via 560 or a neighboring HKMG structure 140. If the electrical shorting occurs, it could lead to device performance degradations or even failures. Therefore, it may be desirable to ensure that the landing shift of the source/drain via 550 is no greater than about 3 nanometers in either the positive X-direction or in the negative X-direction.

At this stage of fabrication, various components of the IC device 200 may have various vertical dimensions and horizontal dimensions, which are labeled herein as T1-T6 and L1-L2 respectively, as shown in FIG. 12A. For example, T1 represents the vertical distance between the upper surface of the ILD 185 and the upper surface of the layer 155. In some embodiments, T1 is in a range between about 5 nanometers and about 20 nanometers.

T2 represents the vertical distance between the upper surface of the layer 155 and the uppermost point of protrusion of the conductive capping layer 300. In some embodiments, T2 is in a range between about 20 nanometers and about 50 nanometers. In some embodiments, a sum of T1 and T2 is in a range between about 20 nanometers and about 60 nanometers. It is understood that the sum of T1 and T2 may correspond to the height or vertical dimension of the conductive material 400 (e.g., Mo) portion of the source/drain contact.

T3 represents the vertical distance between the uppermost point of protrusion of the conductive capping layer 300 and the bottommost point of protrusion of the conductive capping layer 300. In other words, T3 represents the maximum thickness of the conductive capping layer 300. In some embodiments, T3 is in a range between about 5 nanometers and about 15 nanometers. Note that since the conductive material 400 constitutes a majority of the source/drain contact, it is substantially thicker than the conductive capping layer 300. In other words, the sum of T1 and T2 is substantially greater than T3. In some embodiments, T2 alone is greater than T3.

T4 represents the vertical distance between the bottommost point of the upper surface of the silicide layer 260 and the bottommost point of the silicide layer 260. In other words, T4 represents the maximum thickness of the silicide layer 260. In some embodiments, T4 is in a range between about 3 nanometers and about 10 nanometers. In some embodiments, T3 is greater than T4, meaning that the conductive capping layer is thicker than the silicide layer 260. In some embodiments, a ratio of T3:T4 is in a range between about 1.5:1 and about 2:1.

Since the conductive material 400, the conductive capping layer 300, and optionally the silicide layer 260 may collectively constitute the source/drain contact, it may also be said that the sum of T1, T2, T3, and T4 represents the thickness (in the Z-direction) of the source/drain contact. In other words, the thickness of the source/drain contact=T1+T2+T3+T4. If the silicide layer 260 is excluded from the source/drain contact, then the thickness of the source/drain contact=T1+T2+T3.

Still referring to FIG. 12A, T5 represents the vertical distance between the bottommost point of an upper surface of the source/drain component 122 and the bottommost point of the bottom surface of the source/drain component 122 in the X-cut view of FIG. 12A. In other words, T5 roughly represents the thickness of the source/drain component 122 in the X-cut view. In some embodiments, T5 is in a range between about 4 nanometers and about 20 nanometers.

T6 represents the vertical distance between an upper surface of the source/drain via 550 and a bottom surface of the source/drain via 550. In other words, T6 represents the thickness (in the Z-direction) of the source/drain via 550. In some embodiments, T6 is in a range between about 10 nanometers and about 30 nanometers. Also note that the thickness (in the Z-direction) of the gate via 560 is substantially equal to a sum of T1 and T6. As such, the gate via 560 is thicker than the source/drain via 550. However, a combined vertical dimension of the source/drain contact and the source/drain via 550 is equal to a sum of T1+T2+T3+T4+T6, which is greater than the thickness or vertical dimension of the gate via 560, which is a sum of T1+T6.

L1 represents the maximum lateral dimension (in the X-direction) of the conductive material 400. In other words, L1 represents a width of the source/drain contact. In some embodiments, L1 is in a range between about 10 nanometers and about nanometers.

L2 represents the maximum lateral dimension (in the X-direction) of the conductive capping layer 300. In some embodiments, L2 is less than L1, meaning that the conductive capping layer 300 is not as wide as the conductive material 400. In some embodiments, L2 is in a range between about 8 nanometers and about 20 nanometers. This is because some portions of the silicide layer 260—which laterally surrounds the conductive capping layer 300 in the X-cut view of FIG. 12A—are in direct contact with portions of the conductive material 400. This aspect is illustrated in more detail in FIG. 13A, which is a magnified view of a portion of the IC device 200.

Figure 13A:
Figure 13A:
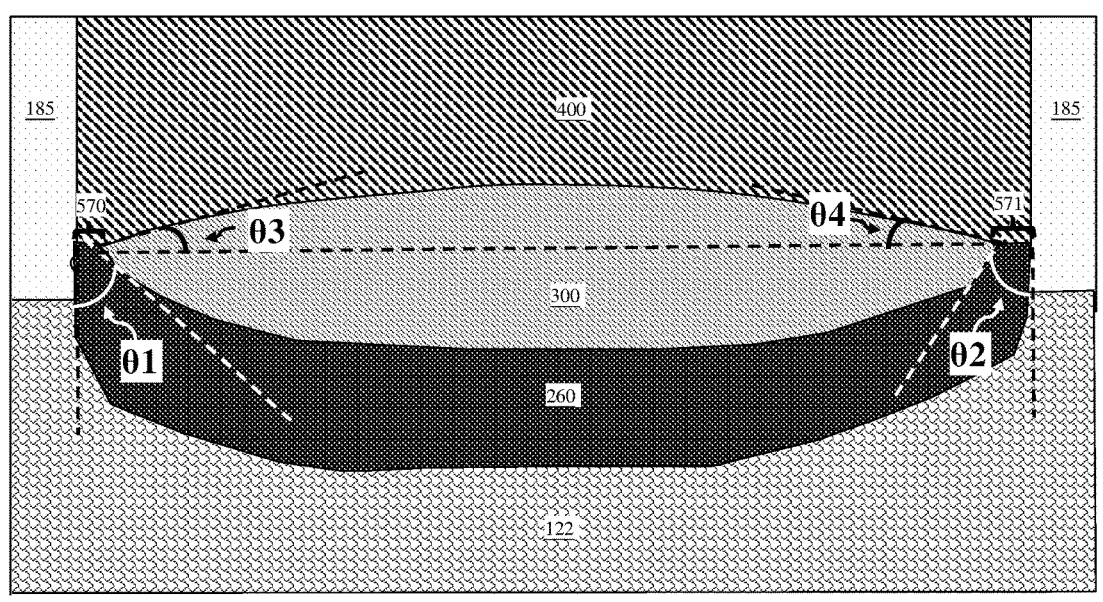

Referring to FIG. 13A, near the "left" sidewall defined by a portion of the ILD 185, a bottom left tip of the conductive material 400 may form an interface 570 with the top left tip of the silicide layer 260. Similarly, near the "right" sidewall defined by a different portion of the ILD 185, a bottom right tip of the conductive material 400 may form an interface 571 with the top right tip of the silicide layer 260. In some embodiments, the interface 570 and the interface 571 may each be in a range between about 0.5 nanometers and about 2 nanometers. Again, the existence of the interface 570 and the interface 571 means that the conductive capping layer 300 is not as wide as the conductive material 400, since portions of the conductive material 400 effectively surround the conductive capping layer 300 laterally.

FIG. 13A also clearly illustrates various angles θ1-θ4 defined by various components of the IC device 200. For example, θ1 is an angle that is defined by tangent lines taken at the top left surface and the bottom left (or side) surface of the silicide layer 260. θ2 is an angle that is defined by tangent lines taken at the top right surface and the bottom right (or side) surface of the silicide layer 260. In some embodiments, θ1 and θ2 are each in a range between about 10 degrees and about 40 degrees. θ3 is an angle that is defined by a tangent line taken at the top left surface of the conductive capping layer 300 and an imaginary horizontal axis that extends in the X-direction. θ4 is an angle that is defined by a tangent line taken at the top right surface of the conductive capping layer 300 and the imaginary horizontal axis that extends in the X-direction. In some embodiments, θ3 and θ4 are each in a range between about 10 degrees and about 30 degrees. In some embodiments, each of the angles θ1 and θ2 is greater than each of the angles θ3 and θ4. For example, the angle θ1 is greater than the angle θ3 by about 0-10 degrees, and the angle θ2 is greater than the angle θ4 by about 0-10 degrees.

Another unique feature of the IC device 200 of the present disclosure is that the silicide layer 260 may not be symmetrical, and the conductive capping layer 300 may not be symmetrical either. For example, the angle θ1 may not be equal to the angle θ2, and the angle θ3 may not be equal to the angle θ4. Such an asymmetry is an inherent result of the unique fabrication process flow discussed above being performed. For example, the etching of the source/drain contact opening 240 (see FIG. 2A) may have a tilt angle, so that one of the sidewalls of the source/drain contact opening 240 may be slanted more or less than the opposite sidewall of the source/drain contact opening 240. As another example, the silicidation process 250 (see FIGS. 3A-3B) or the deposition process 280 (see FIGS. 4A-4B) may not form the silicide layer 260 or the conductive capping layer 300 to have uniform thicknesses. As a result, one side (e.g., left side) of the silicide layer 260 and/or the conductive capping layer 300 may protrude or tilt upwards more or less than the other side (e.g., right side) of the silicide layer 260 and/or the conductive capping layer 300. As a further example, the oxygen treatment process 320 (see FIGS. 5A-5B) may not oxidize the conductive capping layer 300 and the silicide layer 260 evenly, and the subsequent metal oxide removal process 360 (see FIGS. 6A-6B) may not remove the metal oxide layers 330 and 340 evenly either. As a result, some portions (e.g., on the left side) of the remaining silicide layer 260 and/or the conductive capping layer 300 may be more or less elevated vertically than other portions (e.g., on the right side) of the remaining silicide layer 260 and/or the conductive capping layer 300.

Regardless of the specific cause, the resulting structural characteristic may still be the asymmetry of the silicide layer 260 and/or the conductive capping layer 300. Such an asymmetry is not only visible in the X-cut views of FIGS. 12A-13A, but also visible in the Y-cut view of FIG. 12B. It is also noted that the asymmetry of the silicide layer 260 or the asymmetry of the conductive capping layer 300 discussed above may be partially reflected in the interfaces 570 and 571. For example, the interfaces 570 and 571 may have different widths and/or may be tilted at different angles from one another.

Figure 14A:
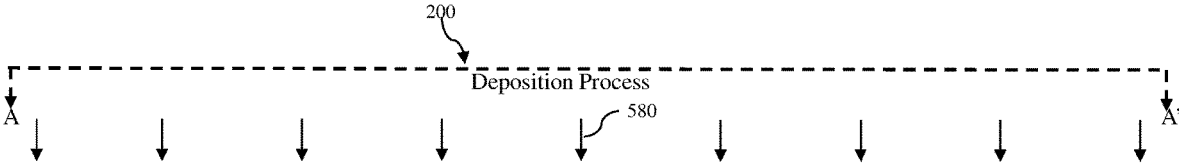
Figure 14A:
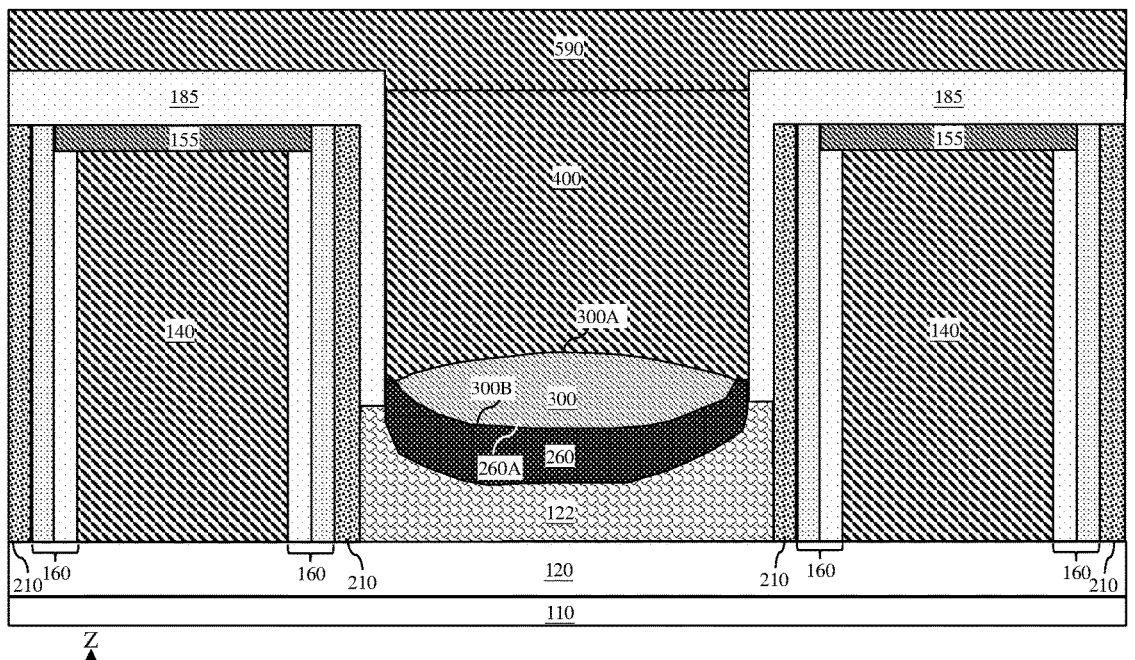

FIG. 14A illustrates a processing step according to an alternative embodiment of the present disclosure. The stage of fabrication illustrated in FIG. 14A is similar to that illustrated in FIGS. 8A, and therefore similar components illustrated in FIG. 8A will be labeled the same in FIG. 14A. For example, the conductive material 400 has already been deposited into the source/drain contact opening 240. Unlike the embodiment of FIG. 8A, however, the embodiment of FIG. 14A performs a deposition process 580 to deposit a conductive material 590 over the conductive material 400 and over the ILD 185. The conductive material 590 may have a same material composition as the conductive material 400. In other words, in embodiments where the conductive material 400 is Mo, the conductive material 590 may be Mo as well.

It is understood that the fabrication processes performed thereafter may be substantially the same as those discussed above with reference to FIGS. 9A-12A. For example, the planarization process 450 of FIG. 9A may be performed to remove portions of the ILD 185 and the deposited conductive material 400, the ILD formation process 470 of FIG. 10A may be performed to form the ILD 485, the etching processes 490 of FIG. 11A may be performed to etch the source/drain via opening 500 and the gate via openings 510, and the deposition process 530 of FIG. 12A may be performed to fill the source/drain via opening 500 and the gate via openings 510 with the source/drain via 550 and the gate vias 560. For reasons of simplicity, these details of these processes are not repeatedly discussed herein.

Figure 15A:
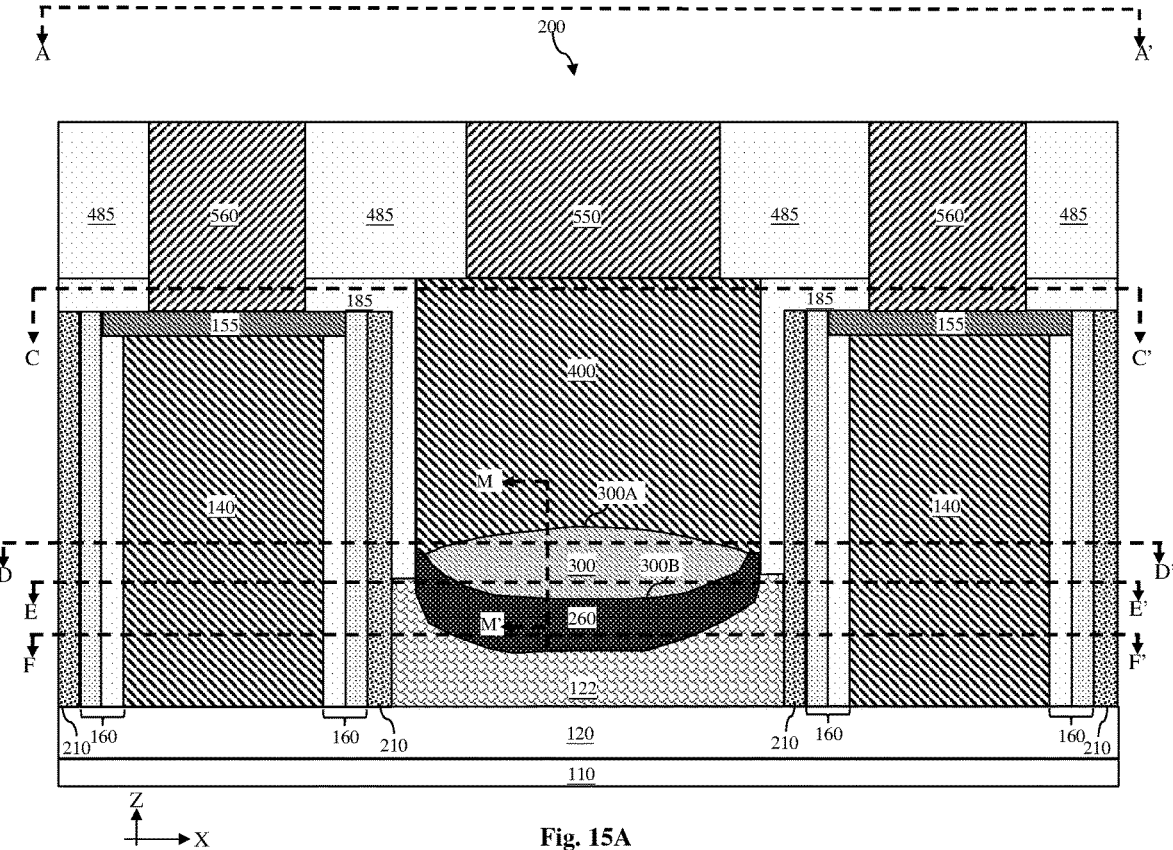

FIGS. 15A and 16-19 illustrate additional aspects of the IC device 200. In more detail, FIG. 15A illustrates a X-cut cross-sectional view of the IC device 200 in a stage of fabrication corresponding to FIG. 12A, and FIGS. 16-19 illustrate simplified diagrammatic fragmentary planar views of the IC device 200 corresponding to cutlines C-C', D-D', E-E', and F-F' (shown in FIG. 15A) that are taken at different depths of the IC device 200, respectively. The planar views of FIGS. 16-19 are shown in a horizontal plane defined by the X-direction and the Y-direction.

Figure 16:
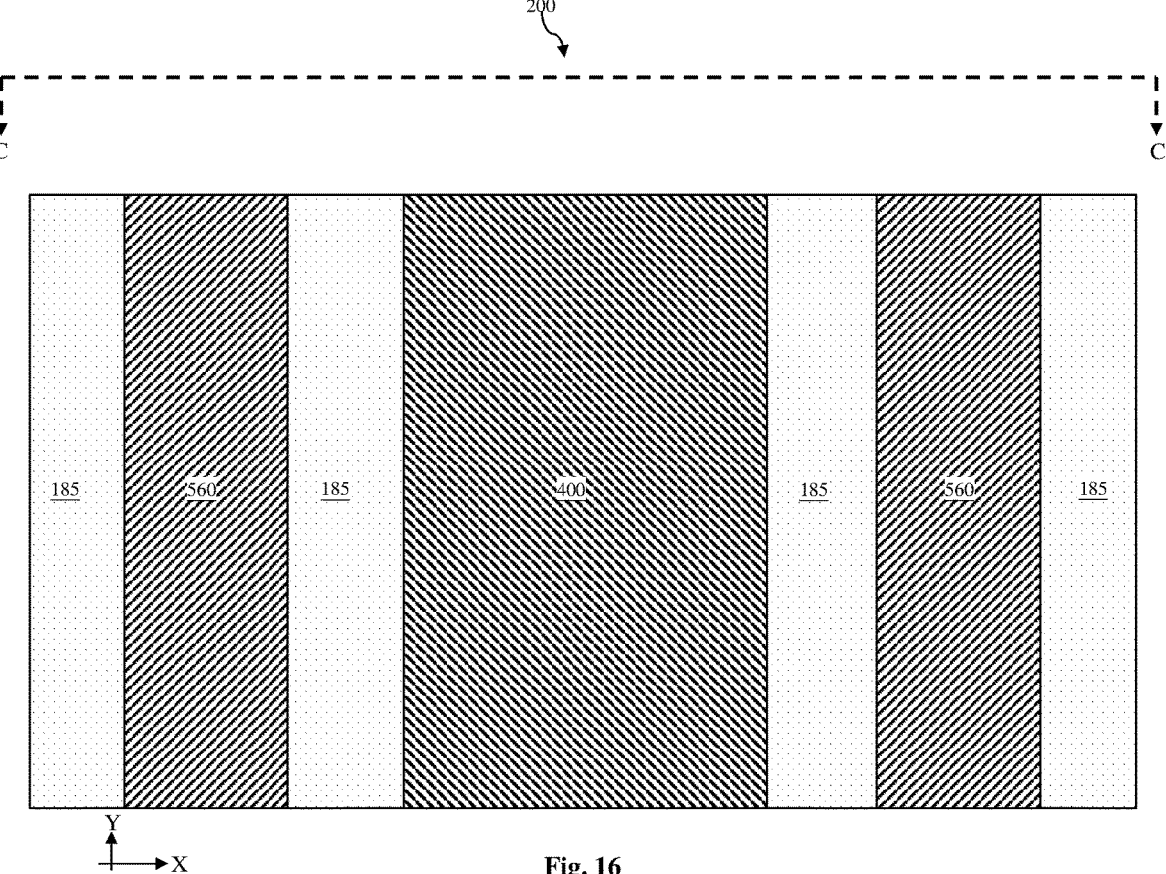
FIGS. 16-19 illustrate planar views of a semiconductor device at various depth levels according to embodiments of the present disclosure.

Referring now to FIGS. 15 and 16, the cutline C-C' is taken at a depth level near, but still below, an upper surface of the conductive material 400. As shown in FIG. 15A, the cutline C-C' extends horizontally through portions of the ILD 185, the gate vias 560, and the conductive material 400. As shown in FIG. 16, the gate vias 560 and the conductive material 400 are elongated in the Y-direction and are spaced apart or separated from one another by different portions of the ILD 185 in the X-direction.

Figure 17:
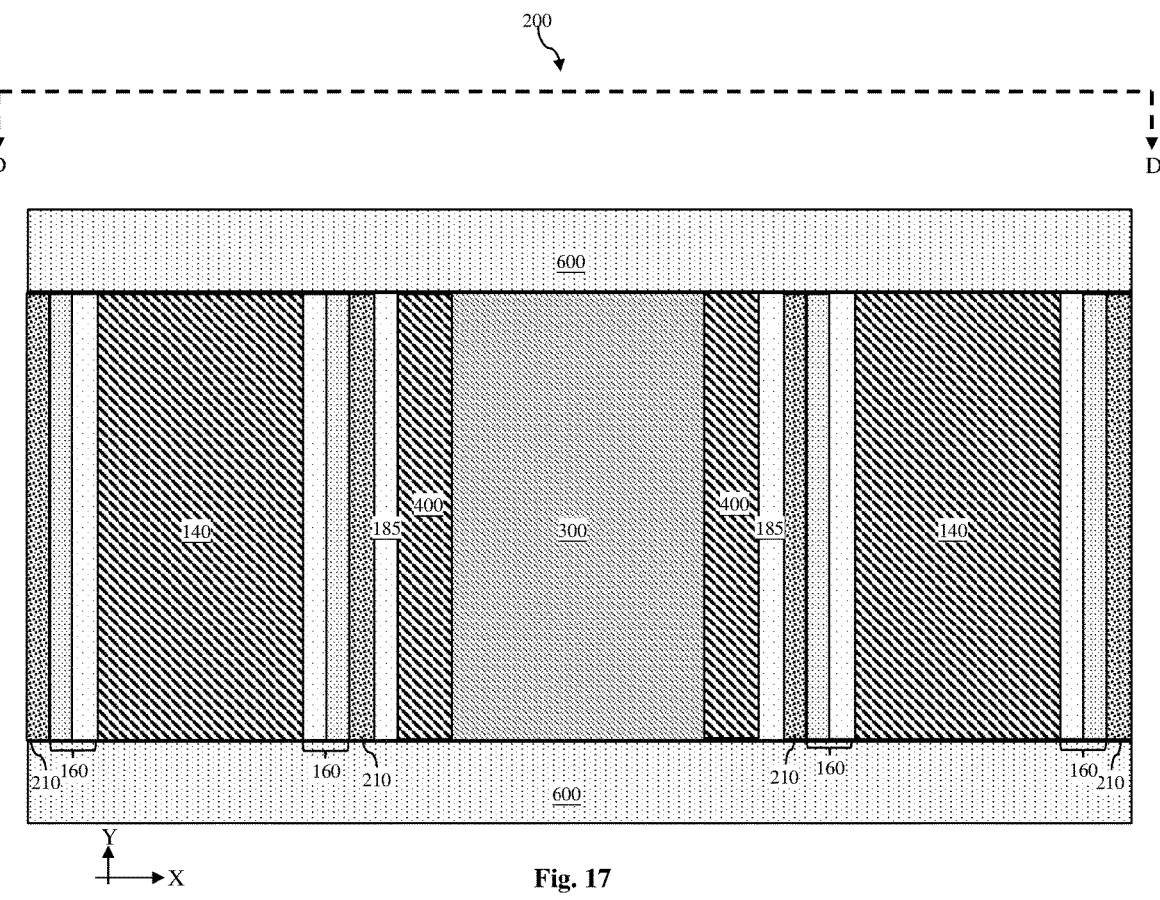

Referring now to FIGS. 15 and 17, the cutline D-D' is taken at a depth level near, but still below, the upper surface 300A of the conductive capping layer 300. At this depth level, the cutline D-D' cuts cross both the conductive material 400 and the conductive capping layer 300 of the source/drain contact. In addition, the cutline D-D' cuts across portions of the etching-stop layer 210, the gate spacer structures 160, the HKMG structures 140, and the ILD 185 on both sides of the source/drain contact. As shown in FIG. 17, the etching-stop layer 210, the gate spacer structures 160, HKMG structures 140, the ILD 185, the conductive material 400, and the conductive capping layer 300 are each elongated in the Y-direction. One side of the conductive material 400 is in direct contact with the conductive capping layer 300, while an opposite side of the conductive material 400 is in direct contact with the ILD 185, since the conductive material 400 is formed without barrier layers or glue layers.

It is understood that the fact that the conductive material 400 and the conductive capping layer 300 are simultaneously visible in a same planar view (such as FIG. 17) is one of the unique and physical traits of the IC device fabricated according to the process flow of the present disclosure discussed above. This is because the simultaneous appearance of the conductive material 400 and the conductive capping layer 300 is an inherent result of the conductive capping layer 300 forming a curved interface (e.g., coinciding with the upper surface 300A of the conductive capping layer 300) with the conductive material 400. This curved interface intersects with the cutline D-D', such that a minority portion of the conductive capping layer 300 is disposed above the cutline D-D' in the cross-sectional view of FIG. 15A, while a majority portion of the conductive capping layer 300 is disposed below the cutline D-D'. Similarly, a majority portion of the conductive material 400 is disposed above the cutline D-D' in the cross-sectional view of FIG. 15A, while the bottom corner tip portions of the conductive material 400 are disposed below the cutline D-D' in the cross-sectional view of FIG. 15A. Such a relative disposition between the conductive material 400 and the conductive capping layer 300 in the X-cut cross-sectional view of FIG. 15A manifests itself as the simultaneous appearance of the conductive material 400 and the conductive capping layer 300 in the planar view of FIG. 17, where the conductive material 400 are laterally disposed around the conductive capping layer 300.

FIG. 17 further illustrates non-functional fin regions 600, which are elongated in the X-direction. In some embodiments, the non-functional fin regions 600 include dielectric fin structures (also referred to as dummy fin structures). The dielectric fin structures are not used to form source/drain or channel regions of transistors, and instead, they may be formed for other reasons, such as providing electrical isolation, improving pattern density uniformity, and/or reducing a loading effect. As shown in FIG. 17, the non-functional fin regions 600 may be disposed both "above" and "below"

the conductive material 400, the conductive capping layer 300, the etching-stop layer 210, the gate spacer structures 160, the HKMG structures 140, and the ILD 185 in the Y-direction in the planar view.

Figure 18:
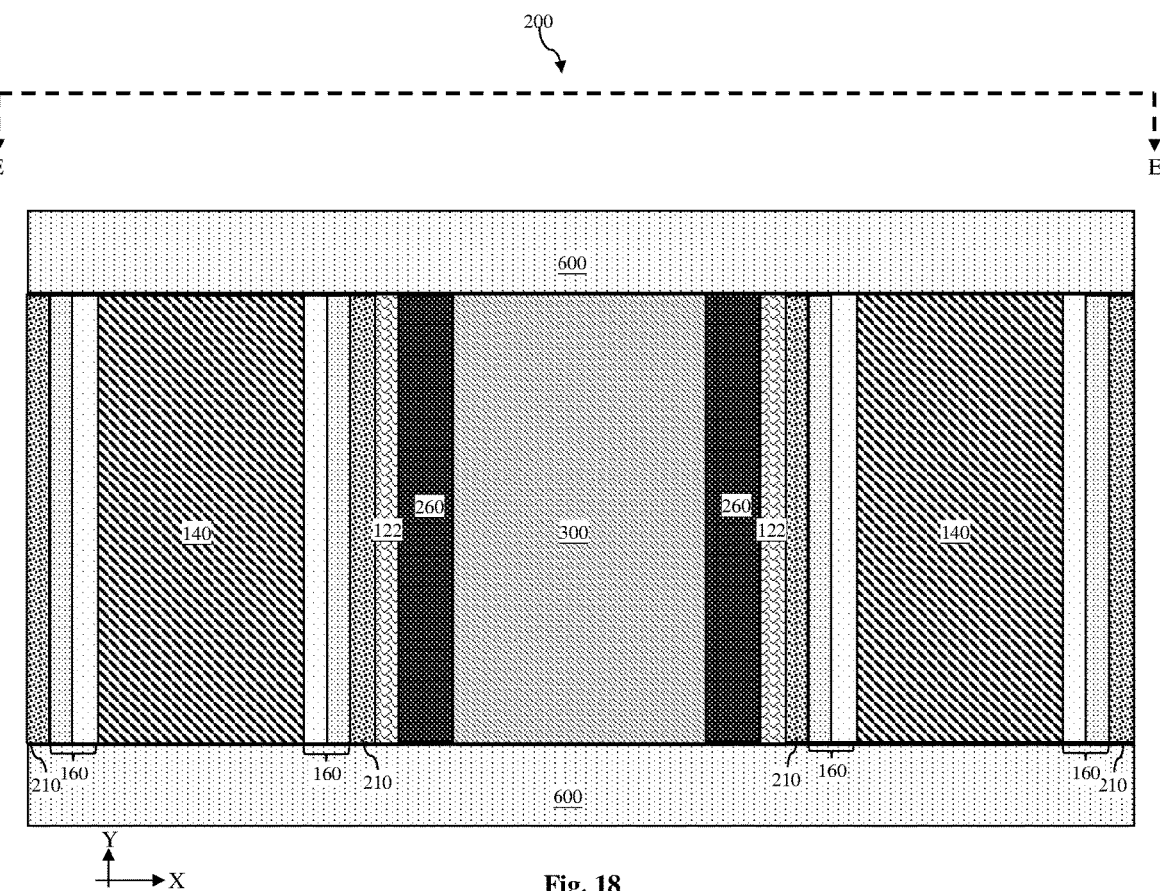

Referring now to FIGS. 15 and 18, the cutline E-E' is taken at a depth level near, but still above, the bottom surface 300B of the conductive capping layer 300. At this depth level, the cutline E-E' cuts cross both the silicide layer 260 and the conductive capping layer 300 of the source/drain contact. In addition, the cutline E-E' cuts across portions of the etching-stop layer 210, the gate spacer structures 160, the HKMG structures 140, and the source/drain components 122 on both sides of the silicide layer 260. As shown in FIG. 18, the etching-stop layer 210, the gate spacer structures 160, HKMG structures 140, the source/drain components 122, the silicide layer 260, and the conductive capping layer 300 are each elongated in the Y-direction. One side of the silicide layer 260 is in direct contact with the conductive capping layer 300, while an opposite side of the silicide layer 260 is in direct contact with the source/drain component 122. The non-functional fin regions 600 still are located "above" and "below" the other layers in FIG. 18.

Note that had the cutline E-E' been moved further "up" somewhat in FIG. 15A, it would have cut across the ILD 185 instead of the source/drain components 122. In that case, the source/drain components 122 in the top view of FIG. 18 would have been replaced with the ILD 185.

Figure 19:
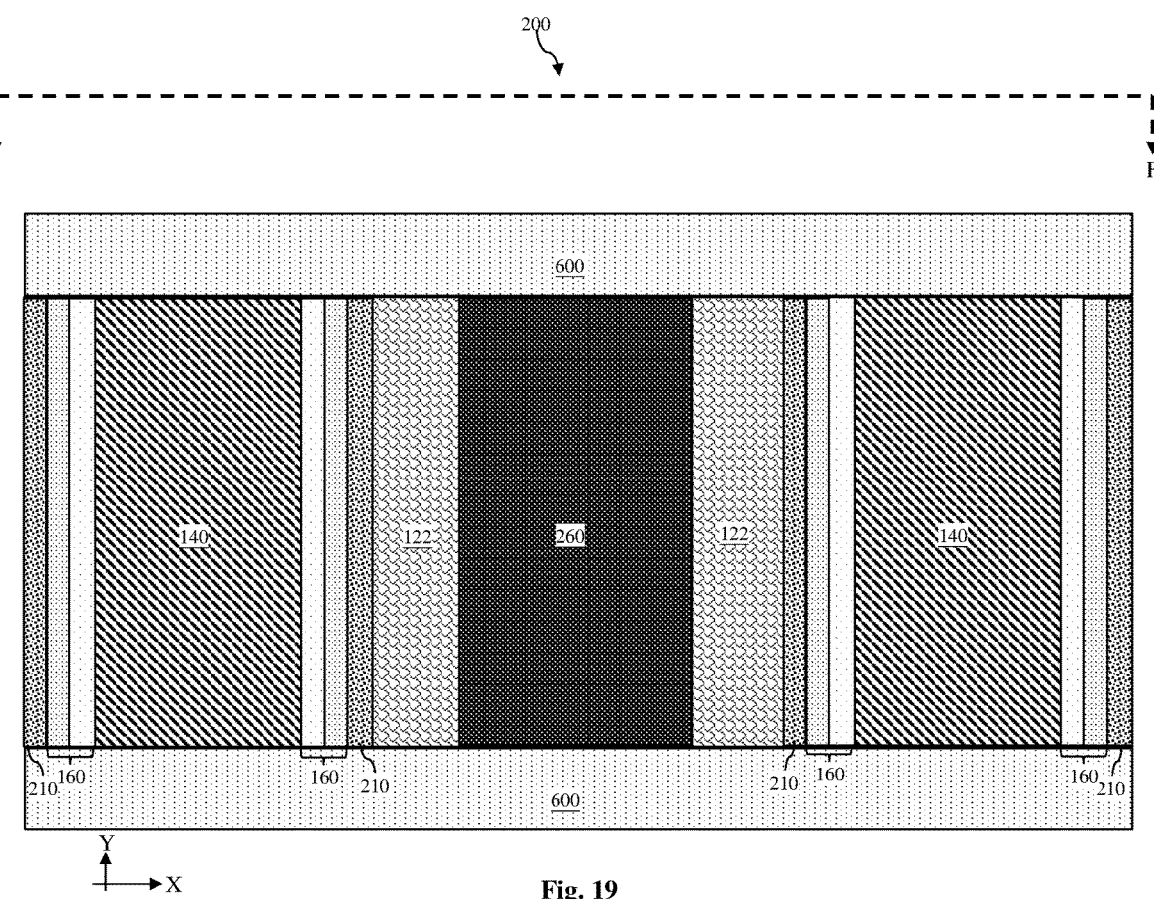

Referring now to FIGS. 15 and 19, the cutline F-F' is taken at a depth level near, but still above, the bottom surface of the silicide layer 260. At this depth level, the cutline F-F' cuts cross the silicide layer 260, but not the conductive capping layer 300 or the conductive material 400 of the source/drain contact. In addition, the cutline F-F' cuts across portions of the etching-stop layer 210, the gate spacer structures 160, the HKMG structures 140, and the source/drain components 122 on both sides of the silicide layer 260. As shown in FIG. 19, the etching-stop layer 210, the gate spacer structures 160, HKMG structures 140, the source/drain components 122, and the silicide layer 260 are each elongated in the Y-direction. The opposite sides of the silicide layer 260 are in direct contact with the source/drain components 122. The non-functional fin regions 600 still are located "above" and "below" the other layers in FIG. 19.

FIG. 20 illustrates a graph 700 that plots the concentration levels of different elements, such as Mo, W, O, and Cl, in a portion of the source/drain contact of the IC device 200 discussed above. In more detail, the horizontal axis of the graph 700 represents depth within the IC device 200, where the depth is taken from a point M to a point M' as shown in FIG. 15A. The direction of the horizontal axis of FIG. 20 corresponds to the direction of the Z-axis of FIG. 15A. The vertical axis of the graph 700 represent the concentration level of the elements within the IC device 200. The concentration level may be measured using a number of atoms per cubic centimeter (atoms/cc) in some embodiments, or by atomic weight in some other embodiments. In some embodiments, the horizontal axis of the graph 700 is in a linear scale, but the vertical axis of the graph 700 is in a logarithmic scale.

The portion of the IC device 200 corresponding to the graph 700 includes a portion of the conductive material 400 (corresponding to a left portion of the graph 700), a portion of the conductive capping layer 300 (corresponding to a middle portion of the graph 700), and a portion of the silicide layer 260 (corresponding to a right portion of the graph 700). As discussed above, the conductive material 400 and the conductive capping layer 300 form the interface 300A, and the conductive capping layer 300 and the silicide layer 260 form the interface 300B.

The graph 700 also shows a region A that spans across the interface 300A. According to various aspects of the present disclosure, an oxide mixture is present at the region A, which may be due to the oxygen treatment process 320 (see FIGS. 5A-5B). In other words, the performance of the oxygen treatment process 320 may leave a metal oxide residue, such as tungsten oxide and/or titanium oxide, even after the metal oxide removal process 360 (see FIGS. 6A-6B) is performed to remove a substantial majority of the metal oxide. Such a metal oxide residue is detectable at least in the portion of the IC device 200 corresponding to the region A of FIG. 20, but it may be detectable in other regions of the IC device 200 as well. In some embodiments, a length of the region A is in a range between about 5 nanometers and about 20 nanometers. In some embodiments, an oxide concentration at the interface 300A (i.e., the interface between the conductive material 400 and the conductive capping layer 300) is in a range between about 1E16 atoms/cc and about 1E19 atoms/cc, or is in a range between about 1% and about 10% by atomic weight. Such a concentration level range is an inherent result of the oxygen treatment process 320 of the present disclosure being performed. If an IC device exhibits such an oxide concentration level at an interface equivalent to the interface 300A of FIG. 20, it may constitute evidence that the IC device had been fabricated using the process flow of the present disclosure discussed above.

In addition, since the conductive material 400 is formed using a precursor that contains chlorine (e.g., $MoCl_x$), chorine (Cl) is also detectable at various depths of the IC device 200 according to the graph 700. For example, at the interface 300A (i.e., the interface between the conductive material 400 and the conductive capping layer 300), the concentration of chlorine is in a range between about 1E17 atoms/cc and about 1E19 atoms/cc, or is in a range between about 0.1% and about 8% by atomic weight. In addition, at the interface 300A, a concentration ratio of oxide to molybdenum is in a range between about 0.02:1 and about 0.2:1, and a concentration ratio of chlorine to molybdenum is in a range between about 0.08:1 and about 0.2:1. These range values are inherent results of the deposition process 390 (see FIGS. 7A-7B, which may use the $MoCl_x$ precursor) of the present disclosure being performed. If an IC device exhibits such a chlorine concentration level range, or the ratio ranges involving chlorine, molybdenum, and oxide, at an interface equivalent to the interface 300A of FIG. 20, it may further constitute evidence that the IC device had been fabricated using the process flow of the present disclosure discussed above.

The graph 700 also shows a region B that spans across the interface 300B. In some embodiments, an oxide concentration in the region B is in a range between about 1E20 atoms/cc and about 1E21 atoms/cc, or is in a range between about 10% and about 25% by atomic weight. In addition, at the region B, a concentration ratio of oxide to tungsten is in a range between about 0.85:1 and about 0.99:1, and a concentration ratio of chlorine to tungsten is in a range between about 0.01:1 and about 0.1:1. Again, these range values are inherent results of the oxygen treatment process 320 and the deposition process 390 of the present disclosure being performed. If an IC device exhibits such concentration level ranges and ratio ranges regarding oxide, tungsten, and chlorine at an interface equivalent to the interface 300B of FIG. 20, it may further constitute evidence that the IC device had been fabricated using the process flow of the present disclosure discussed above.

Based on the graph 700, it can be seen that the concentration of molybdenum is at a relatively high level throughout most of the conductive material 400, but it begins to trail off in the region A and drops more substantially in the rest of the conductive capping layer 300 and in the silicide layer 260. The dominance of the concentration of molybdenum (e.g., the concentration of molybdenum is substantially greater than the concentrations of tungsten, oxygen, and chlorine) in the conductive material 400 is attributed to the MoCl$_x$ precursor being used in the deposition process 390 (see FIGS. 7A-7B) to deposit molybdenum as the conductive material 400 to fill the source/drain contact opening 240.

Meanwhile, the concentration of tungsten is relatively low throughout most of the conductive material 400, but it begins to rise rapidly near the region A, until a peak concentration level is reached in a majority portion of the conductive capping layer 300. Thereafter, the concentration of tungsten begins to decline as the depth approaches the region B, and the decline continues into the region B and the rest of the silicide layer 260. The dominance of the concentration of tungsten (e.g., the concentration of tungsten is greater than the concentrations of molybdenum, oxygen, and chlorine) in the conductive capping layer 300 is attributed to the deposition process 280 (see FIGS. 4A-4B) utilizing PVD to deposit tungsten as the conductive capping layer 300 to fill the bottom of the source/drain contact opening 240.

With respect to the concentration of oxygen, it starts at a relatively high level in the conductive material 400 but begins to decline through the rest of the conductive material (including the region A), until a lowest point is reached somewhere in the conductive capping layer 300. Thereafter, the concentration of oxygen begins to climb until a zenith is reached in the silicide layer 260 portion of the region B. The concentration of oxygen then begins to decline in the rest of the region B, but it climbs again in the rest of the silicide layer 260 (outside of the region B). The dominance of the concentration of oxygen (e.g., the concentration of oxygen is greater than the concentrations of molybdenum, tungsten, and chlorine) in the silicide layer 260 is partially attributed to the fact that the metal oxide removal process 360 (see FIGS. 6A-6B) may not be able to completely remove all of the metal oxide formed as a result of the oxygen treatment process 320 (see FIGS. 5A-5B), and the remaining metal oxide residue may contribute to the relatively high oxygen concentration level in the silicide layer 260. In addition, the oxide content from the surrounding ILD 185 may also diffuse into the silicide layer 260, which also contributes to the relatively high oxygen concentration level in the silicide layer 260. Furthermore, when the IC device undergoes different processes (e.g., between the silicidation process 250 of FIGS. 3A-3B and the deposition process 280 of FIGS. 4A-4B), it may be exposed to ambient oxygen as the wafer containing the IC device is transferred between different processing tools. The ambient oxygen exposure may further contribute to the relatively high oxygen concentration level in the silicide layer 260.

Lastly, with respect to the concentration of chlorine, it starts at a peak level in the conductive material 400 but begins to decline until a temporary nadir is reached at some depth still within the conductive material 400. The concentration of chlorine then begins to rise until a local peak is reached in the region A (but still within the conductive material 400), after which it begins to decline again until another temporary nadir is reached at some depth within the conductive capping layer 300. The concentration of chlorine then begins to rise until another local peak is reached in the region B, for example, near the interface 300B. Thereafter, the concentration of chlorine declines again into the rest of the silicide layer 260. Although the concentration of chlorine does not dominate at any of the regions shown in FIG. 20, it is nevertheless detectable by a machine, for example, by a Transmission Electron Microscope (TEM), particularly in the conductive material 400. As discussed above, the presence of chlorine is an inherent byproduct of the unique fabrication process flow being performed herein, and it may constitute evidence that a source/drain contact of an IC device has been fabricated using the process flow discussed herein.

The IC device 200 may be implemented in a variety of IC applications, including memory devices such as Static Random-Access Memory (SRAM) devices. In that regard, FIG. 21 illustrates an example circuit schematic for a single-port SRAM cell (e.g., 1-bit SRAM cell) 800 in which the IC device 200 may be implemented. The single-port SRAM cell 800 includes pull-up transistors PU1, PU2; pull-down transistors PD1, PD2; and pass-gate transistors PG1, PG2. As show in the circuit diagram, transistors PU1 and PU2 are p-type transistors, and transistors PG1, PG2, PD1, and PD2 are n-type transistors. According to the various aspects of the present disclosure, the PG1, PG2, PD1, and PD2 transistors are implemented with thinner spacers than the PU1 and PU2 transistors. Since the SRAM cell 800 includes six transistors in the illustrated embodiment, it may also be referred to as a 6T SRAM cell.

The drains of pull-up transistor PU1 and pull-down transistor PD1 are coupled together, and the drains of pull-up transistor PU2 and pull-down transistor PD2 are coupled together. Transistors PU1 and PD1 are cross-coupled with transistors PU2 and PD2 to form a first data latch. The gates of transistors PU2 and PD2 are coupled together and to the drains of transistors PU1 and PD1 to form a first storage node SN1, and the gates of transistors PU1 and PD1 are coupled together and to the drains of transistors PU2 and PD2 to form a complementary first storage node SNB1. Sources of the pull-up transistors PU1 and PU2 are coupled to power voltage Vcc (also referred to as Vdd), and the sources of the pull-down transistors PD1 and PD2 are coupled to a voltage Vss, which may be an electrical ground in some embodiments.

The first storage node SN1 of the first data latch is coupled to bit line BL through pass-gate transistor PG1, and the complementary first storage node SNB1 is coupled to complementary bit line BLB through pass-gate transistor PG2. The first storage node SN1 and the complementary first storage node SNB1 are complementary nodes that are often at opposite logic levels (logic high or logic low). Gates of pass-gate transistors PG1 and PG2 are coupled to a word line WL. SRAM devices such as the SRAM cell 800 may be implemented using "planar" transistor devices, with FinFET devices, and/or with GAA devices.

FIG. 22 illustrates an integrated circuit fabrication system 900 according to embodiments of the present disclosure, which may be used to fabricate the IC device 200 of the present disclosure. The fabrication system 900 includes a plurality of entities 902, 904, 906, 908, 910, 912, 914, 916 . . . , N that are connected by a communications network 918. The network 918 may be a single network or may be a variety of different networks, such as an intranet and the Internet, and may include both wire line and wireless communication channels.

In an embodiment, the entity 902 represents a service system for manufacturing collaboration; the entity 904 represents an user, such as product engineer monitoring the interested products; the entity 906 represents an engineer, such as a processing engineer to control process and the relevant recipes, or an equipment engineer to monitor or tune the conditions and setting of the processing tools; the entity 908 represents a metrology tool for IC testing and measurement; the entity 910 represents a semiconductor processing tool, such an EUV tool that is used to perform lithography processes to define the gate spacers of an SRAM device; the entity 912 represents a virtual metrology module associated with the processing tool 910; the entity 914 represents an advanced processing control module associated with the processing tool 910 and additionally other processing tools; and the entity 916 represents a sampling module associated with the processing tool 910.

Each entity may interact with other entities and may provide integrated circuit fabrication, processing control, and/or calculating capability to and/or receive such capabilities from the other entities. Each entity may also include one or more computer systems for performing calculations and carrying out automations. For example, the advanced processing control module of the entity 914 may include a plurality of computer hardware having software instructions encoded therein. The computer hardware may include hard drives, flash drives, CD-ROMs, RAM memory, display devices (e.g., monitors), input/output device (e.g., mouse and keyboard). The software instructions may be written in any suitable programming language and may be designed to carry out specific tasks.

The integrated circuit fabrication system 900 enables interaction among the entities for the purpose of integrated circuit (IC) manufacturing, as well as the advanced processing control of the IC manufacturing. In an embodiment, the advanced processing control includes adjusting the processing conditions, settings, and/or recipes of one processing tool applicable to the relevant wafers according to the metrology results.

In another embodiment, the metrology results are measured from a subset of processed wafers according to an optimal sampling rate determined based on the process quality and/or product quality. In yet another embodiment, the metrology results are measured from chosen fields and points of the subset of processed wafers according to an optimal sampling field/point determined based on various characteristics of the process quality and/or product quality.

One of the capabilities provided by the IC fabrication system 900 may enable collaboration and information access in such areas as design, engineering, and processing, metrology, and advanced processing control. Another capability provided by the IC fabrication system 900 may integrate systems between facilities, such as between the metrology tool and the processing tool. Such integration enables facilities to coordinate their activities. For example, integrating the metrology tool and the processing tool may enable manufacturing information to be incorporated more efficiently into the fabrication process or the APC module, and may enable wafer data from the online or in site measurement with the metrology tool integrated in the associated processing tool.

FIG. 23 is a flowchart illustrating a method 1000 of fabricating a semiconductor device. The method 1000 includes a step 1010 to etch a source/drain contact opening that extends vertically through a first interlayer dielectric (ILD). The source/drain contact opening exposes a portion of a source/drain component.

The method 1000 includes a step 1020 to form a silicide layer over the source/drain component.

The method 1000 includes a step 1030 to deposit a first metal material over the silicide layer.

The method 1000 includes a step 1040 to transform a portion of the first metal material into a metal oxide layer.

The method 1000 includes a step 1050 to remove the metal oxide layer without removing a rest of the first metal material.

The method 1000 includes a step 1060 to deposit a second metal material over the rest of the first metal material. The second metal material fills a substantial majority of the source/drain contact opening. The second metal material and the first metal material have different material compositions.

In some embodiments, the step 1030 comprises depositing a tungsten-containing material with a physical vapor deposition (PVD) process. In some embodiments, the step 1060 is performed with a chemical vapor deposition (CVD) process that uses a precursor containing both molybdenum and chlorine.

In some embodiments, the step 1040 comprises performing an oxygen treatment process at a process temperature in a range between about 300 degrees Celsius and about 500 degrees Celsius, a process pressure in a range between about 10 Torr and about 30 Torr, and an oxygen flow rate in a range between about 500 standard cubic centimeters per minute (sccm) and about 1500 sccm.

In some embodiments, after the step 1050 is performed, the first metal material has a recessed upper surface. The second metal material is deposited directly on the recessed upper surface of the first metal material.

It is understood that the method 1000 may include further steps performed before, during, or after the steps 1010-1060. For example, the method 1100 may include the following steps: depositing a third metal material over the second metal material and over the first ILD; performing a planarization process that removes the third metal material and portions of the first ILD until the second metal material and a remaining portion of the first ILD have substantially co-planar upper surfaces; forming a second ILD over the substantially co-planar upper surfaces of the second metal material and the first ILD; etching a source/drain via opening and a gate via opening, wherein the source/drain via opening extends vertically through the second ILD and exposes the second metal material, and wherein the gate via opening extends vertically through the second ILD and the first ILD and exposes a gate structure; and filling the source/drain via opening and the gate via opening with a source/drain via and a gate via, respectively, wherein the source/drain via and the gate via each have a different material composition than the second metal material. Other steps may include formation of additional metallization features, packaging, and wafer acceptance testing, etc. For reasons of simplicity, these additional steps are not discussed in detail herein.

In summary, the present disclosure forms a semiconductor device with a source/drain contact that is substantially free of voids and has a reduced resistance. For example, a two-step deposition process is used to form such a source/drain contact. In more detail, a metal silicide layer is formed over a source/drain component of a transistors. Thereafter, a first deposition process deposits a tungsten capping layer (as a minority portion of the source/drain contact) over the metal silicide layer. The first deposition process is configured to achieve a curved (e.g., convex) upper surface for the tungsten capping layer. An oxygen treatment process is then performed to oxidize an upper portion of the tungsten capping layer. The resulting metal oxide may be removed by an etching process, which again exposes the upper surface of the tungsten capping layer, which still has the curved profile. A second deposition process is then performed to deposit molybdenum (as the majority portion of the source/drain contact) over the tungsten capping layer. A source/drain via may then be formed over the source/drain contact (e.g., over a planarized upper surface of the molybdenum material).

Based on the above discussions, it can be seen that the embodiments of the present disclosure offer advantages over conventional devices. It is understood, however, that no particular advantage is required, other embodiments may offer different advantages, and that not all advantages are necessarily disclosed herein. One advantage is that the source/drain contact can be formed to be substantially free of voids or gaps. For example, the first deposition process may be a high-collimated process to partially fill the relatively narrow and deep source/drain contact opening without trapping voids in the deposited tungsten capping layer. The fact that the silicide layer is downwardly recessed also helps the gap filling performance of the tungsten capping layer. By the time the second deposition process is performed, the source/drain contact opening is not as deep as before (e.g., the aspect ratio is not as high), which makes it easier to fill without trapping voids or gaps in the molybdenum material deposited by the second deposition process. Furthermore, the process parameters of both the first deposition process and the second deposition process, as well as the specific material compositions of the deposited metal materials, are specifically configured to reduce the risks of trapping the voids or gaps therein. The elimination (or at least substantial reduction) of the voids or gaps in the resulting source/drain contact can reduce the parasitic resistance of the source/drain contact, since any trapped air bubble in the source/drain contact would contribute greatly to the parasitic resistance thereof (e.g., since air has a much greater electrical resistivity than metal).

The parasitic resistance of the source/drain contact is further reduced by the specifically configured profile of the interface between the molybdenum material and the tungsten capping layer. For example, such an interface may be convex (e.g., upwardly protruding) from the perspective of the tungsten capping layer, or concave (e.g., upwardly recessed) from the perspective of the molybdenum material. Regardless, the interface is rounded or curved, rather than substantially flat. Such a curvature of the interface effectively increases the amount of physical contact area between the tungsten capping layer and the molybdenum material. Molybdenum has a lower resistivity than tungsten, and since molybdenum constitutes a majority portion of the source/drain contact, it is desirable to maximize the surface contact area between the molybdenum material and the tungsten capping layer, so that the lower resistivity of the molybdenum may dominate even more of the overall resistance of the resulting source/drain contact formed by the molybdenum material and the tungsten capping layer below. Therefore, the specifically configured curved interface of the molybdenum material and the tungsten capping layer helps to reduce parasitic resistance. In some embodiments, the reduction of the parasitic resistance may be in a range between about 60% and about 80%. The reduced parasitic resistance may lead to device performance improvements such as faster speed, lower power consumption, better heat dissipation, etc. Yield is also increased as a result, which may be reflected in a wafer acceptance test performance. Other advantages may include ease of fabrication and compatibility with existing fabrication processes.

The advanced lithography process, method, and materials described above can be used in many applications, including in IC devices using fin-type field effect transistors (Fin-FETs). For example, the fins may be patterned to produce a relatively close spacing between features, for which the above disclosure is well suited. In addition, spacers used in forming fins of FinFETs, also referred to as mandrels, can be processed according to the above disclosure. It is also understood that the various aspects of the present disclosure discussed above may apply to multi-channel devices such as Gate-All-Around (GAA) devices. To the extent that the present disclosure refers to a fin structure or FinFET devices, such discussions may apply equally to the GAA devices.

One aspect of the present disclosure pertains to a semiconductor device. A source/drain component is disposed over an active region. A source/drain contact is disposed over the source/drain component. The source/drain contact includes a conductive capping layer and a conductive material having a lower resistivity than the conductive capping layer. The conductive material has a recessed bottom surface that is in direct contact with the conductive capping layer. A source/drain via is disposed over the source/drain contact. The source/drain via and the conductive material have different material compositions.

Another aspect of the present disclosure pertains to a semiconductor device. The semiconductor device includes a source/drain component. A silicide layer is disposed over the source/drain component. A tungsten-containing capping layer is disposed over the silicide layer. The silicide layer forms a first curved interface with the tungsten-containing capping layer. A molybdenum-containing material is disposed over the tungsten-containing capping layer. The tungsten-containing capping layer forms a second curved interface with the molybdenum-containing material. A tungsten-containing source/drain via is disposed over the molybdenum-containing material.

Another aspect of the present disclosure pertains to a method of fabricating a semiconductor device. A source/drain contact opening is etched. The source/drain contact opening extends vertically through a first interlayer dielectric (ILD). The source/drain contact opening exposes a portion of a source/drain component. A silicide layer is formed over the source/drain component. A first metal material is deposited over the silicide layer. A portion of the first metal material is transformed into a metal oxide layer. The metal oxide layer is removed without removing a rest of the first metal material. A second metal material is depo sited over the rest of the first metal material. The second metal material fills a substantial majority of the source/drain contact opening. The second metal material and the first metal material have different material compositions.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A device, comprising:
a source/drain component disposed over an active region and surrounded by a dielectric material;
a source/drain contact disposed over the source/drain component, wherein the source/drain contact contains at least one of chlorine or oxygen, and wherein the source/drain contact includes:
a conductive capping layer; and
a conductive material having a different material composition than the conductive capping layer, wherein the conductive material has a recessed bottom surface that is in direct contact with the conductive capping layer; and
a source/drain via disposed over the source/drain contact, wherein the source/drain via and the conductive material have different material compositions.

2. The device of claim 1, wherein:
the conductive capping layer contains tungsten;
the conductive material contains molybdenum; and
the source/drain via contains tungsten.

3. The device of claim 1, further comprising a silicide layer disposed between the source/drain component and the source/drain contact, wherein the silicide layer has a recessed upper surface that is in direct contact with the conductive capping layer.

4. The device of claim 3, wherein a portion of the silicide layer is in direct contact with the conductive material.

5. The device of claim 1, further comprising:
an interlayer dielectric (ILD) disposed over the active region and surrounding the source/drain contact;
a gate structure disposed over the active region and beside the source/drain contact; and
a gate via disposed over the gate structure;
wherein:
side surfaces of the conductive material are in direct contact with sidewalls of the ILD;
portions of the ILD are interposed between the source/drain contact and the gate structure; and
a vertical dimension of the gate via is smaller than a combined vertical dimension of the source/drain contact and the source/drain via.

6. The device of claim 1, wherein a maximum lateral dimension of the conductive material is greater than a maximum lateral dimension of the conductive capping layer.

7. The device of claim 1, wherein the conductive material is thicker than the conductive capping layer.

8. The device of claim 1, wherein a bottom surface of the conductive capping layer has a curved profile in a cross-sectional side view.

9. A device, comprising:
a source/drain component;
a silicide layer disposed over the source/drain component;
a tungsten-containing capping layer disposed over the silicide layer, wherein the silicide layer forms a first curved interface with the tungsten-containing capping layer, and wherein the tungsten-containing capping layer has a cross-sectional view profile that resembles an ellipse;
a molybdenum-containing material disposed over the tungsten-containing capping layer, wherein the tungsten-containing capping layer forms a second curved interface with the molybdenum-containing material; and
a tungsten-containing source/drain via disposed over the molybdenum-containing material.

10. The device of claim 9, wherein the molybdenum-containing material further contains chlorine and oxygen.

11. The device of claim 9, wherein the first curved interface is asymmetric.

12. The device of claim 9, further comprising an interlayer dielectric that surrounds the tungsten-containing capping layer and the molybdenum-containing material, wherein a portion of the molybdenum-containing material is disposed between the tungsten-containing capping layer and the interlayer dielectric.

13. The device of claim 9, wherein:
the molybdenum-containing material is thicker than the tungsten-containing capping layer; and
the tungsten-containing capping layer is thicker than the silicide layer.

14. The device of claim 9, further comprising:
a gate structure disposed adjacent to the source/drain component; and
a gate via disposed over the gate structure;
wherein:
the gate via contains tungsten and has a smaller vertical dimension than a combined vertical dimension of: the tungsten-containing capping layer, the molybdenum-containing material, and the tungsten-containing source/drain via; and
one or more dielectric materials are interposed between the gate structure and the molybdenum-containing material.

15. The device of claim 9, wherein a portion of the silicide layer is in direct physical contact with a portion of the molybdenum-containing material.

16. A method, comprising:
etching a source/drain contact opening that extends vertically through a first interlayer dielectric (ILD), wherein the source/drain contact opening exposes a portion of a source/drain component;
forming a silicide layer over the source/drain component;
depositing a first metal material over the silicide layer;
transforming a portion of the first metal material into a metal oxide layer;
removing the metal oxide layer without removing a rest of the first metal material; and
depositing a second metal material over the rest of the first metal material, the second metal material filling a substantial majority of the source/drain contact opening, wherein the second metal material and the first metal material have different material compositions.

17. The method of claim 16, wherein:
the depositing the first metal material comprise depositing a tungsten-containing material with a physical vapor deposition (PVD) process; and
the depositing the second metal material is performed with a chemical vapor deposition (CVD) process that uses a precursor containing both molybdenum and chlorine.

18. The method of claim 16, further comprising:
depositing a third metal material over the second metal material and over the first ILD;
performing a planarization process that removes the third metal material and portions of the first ILD until the second metal material and a remaining portion of the first ILD have substantially co-planar upper surfaces;
forming a second ILD over the substantially co-planar upper surfaces of the second metal material and the first ILD;
etching a source/drain via opening and a gate via opening, wherein the source/drain via opening extends vertically through the second ILD and exposes the second metal material, and wherein the gate via opening extends vertically through the second ILD and the first ILD and exposes a gate structure; and filling the source/drain via opening and the gate via opening with a source/drain via and a gate via, respectively, wherein the source/drain via and the gate via each have a different material composition than the second metal material.

19. The method of claim 16, wherein the transforming the portion of the first metal material includes performing an oxygen treatment process at a process temperature in a range between about 300 degrees Celsius and about 500 degrees Celsius, a process pressure in a range between about 10 Torr and about 30 Torr, and an oxygen flow rate in a range between about 500 standard cubic centimeters per minute (sccm) and about 1500 sccm.

20. The method of claim 16, wherein after the removing the metal oxide layer, the first metal material has a recessed upper surface, and wherein the second metal material is deposited directly on the recessed upper surface of the first metal material.

* * * * *